US007820232B2

United States Patent
Itoh et al.

(10) Patent No.: US 7,820,232 B2
(45) Date of Patent: Oct. 26, 2010

(54) METHOD FOR FORMING FINE COPPER PARTICLE SINTERED PRODUCT TYPE OF ELECTRIC CONDUCTOR HAVING FINE SHAPE, AND PROCESS FOR FORMING COPPER FINE WIRING AND THIN COPPER FILM BY APPLYING SAID METHOD

(75) Inventors: Daisuke Itoh, Ibaraki (JP); Akihito Izumitani, Ibaraki (JP); Noriaki Hata, Ibaraki (JP); Yorishige Matsuba, Ibaraki (JP)

(73) Assignee: Harima Chemicals, Inc., Hyogo (JP)

( * ) Notice: Subject to any disclaimer, the term of this patent is extended or adjusted under 35 U.S.C. 154(b) by 866 days.

(21) Appl. No.: 10/556,871

(22) PCT Filed: May 13, 2004

(86) PCT No.: PCT/JP2004/006442

§ 371 (c)(1),
(2), (4) Date: Nov. 15, 2005

(87) PCT Pub. No.: WO2004/103043

PCT Pub. Date: Nov. 25, 2004

(65) Prior Publication Data

US 2006/0210705 A1 Sep. 21, 2006

(30) Foreign Application Priority Data

May 16, 2003 (JP) ............................. 2003-139398
Aug. 12, 2003 (JP) ............................. 2003-292283

(51) Int. Cl.
*C23C 26/00* (2006.01)
*B05D 3/02* (2006.01)

(52) U.S. Cl. ................ 427/96.1; 427/372.2; 427/383.1; 427/404

(58) Field of Classification Search ............ 427/428.13, 427/96.1
See application file for complete search history.

(56) References Cited

U.S. PATENT DOCUMENTS 4,810,528 A * 3/1989 Kondo et al. ............... 427/97.2

5,035,837 A 7/1991 Saeki et al.
2005/0069648 A1 3/2005 Maruyama

FOREIGN PATENT DOCUMENTS

JP 4-57389 2/1992

(Continued)

OTHER PUBLICATIONS

A. Sinha, B.P. Sharma, Preparation of copper powder by glycerol process, Nov. 29, 2001, Materials Research Bulletin 31 (2002) 407-416.*
European Search Report dated Jul. 24, 2009.

*Primary Examiner*—Michael Barr
*Assistant Examiner*—Ryan Schiro
(74) *Attorney, Agent, or Firm*—Knobbe Martens Olson & Bear LLP

(57) ABSTRACT

The present invention provides a process for forming a copper fine particle sintered product type of a fine-shaped electric conductor showing superior electroconductivity, which comprises steps of drawing a fine pattern with the use of a dispersion containing the copper fine particles having a surface oxide film layer, conducting a treatment for reducing the copper fine particles with the surface oxide film layer or copper oxide fine particles included in the pattern at a comparatively low temperature, and baking the resultant copper fine particles. Specifically, the process carries out the processes of; applying a dispersion containing the copper fine particles having the surface oxide film layer thereon or the copper oxide fine particles with an average particle diameter of 10 μm or smaller onto a substrate; and then performing a series of the heat treatment steps of heating the particles in the coated layer at temperature of 350° C. or lower under an atmosphere containing a vapor and a gas of a compound having reducibility to reduce the oxide film by a reduction reaction which used the compound having reducibility as a reducing agent, subsequently repeating a heat treatment combining an oxidizing treatment of a short time with a re-reducing treatment, and sintering the resultant copper fine particles with each other to form a layer of the sintered product.

30 Claims, 2 Drawing Sheets

FOREIGN PATENT DOCUMENTS

| | | |
|---|---|---|
| JP | 6-224538 | 8/1994 |
| JP | 10-294018 | 11/1998 |
| JP | 11-5961 | 1/1999 |
| JP | 11-267879 | 10/1999 |
| JP | 2002-334618 * | 5/2001 |
| JP | 2002-271005 A | 9/2002 |
| JP | 2002-324966 A | 11/2002 |
| WO | WO 03051562 | 6/2003 |

* cited by examiner

Before heat treatment

After heat treatment: 300°C, 5 times

METHOD FOR FORMING FINE COPPER PARTICLE SINTERED PRODUCT TYPE OF ELECTRIC CONDUCTOR HAVING FINE SHAPE, AND PROCESS FOR FORMING COPPER FINE WIRING AND THIN COPPER FILM BY APPLYING SAID METHOD

This application is the U.S. National Phase under 35 U.S.C. §371 of International Application PCT/JP2004/006442, filed May 13, 2004, which claims priority to Japanese Patent Application No. 2003-139398, filed May 16, 2003, and No. 2003-292283, filed Aug. 12, 2003. The International Application was not published under PCT Article 21(2) in English.

TECHNICAL FIELD

The present invention relates to a process for forming a copper-based wiring pattern or a copper thin-film layer with an extremely thin film thickness, and more specifically relates to a process for forming a wiring pattern of a copper-sintered product with low impedance and an extremely fine shape fit for digital high-density wiring, or forming a copper thin-film layer with an extremely thin film-thickness, which comprises the steps of: drawing an ultra fine pattern or forming a thin-film coating layer by using a dispersion of copper fine particles with a surface oxide film layer or copper oxide fine particles, particularly, a dispersion of copper nano-particles with the surface oxide film layer or copper oxide nano-particles; conducting treatment for reducing copper fine particles with the surface oxide film layer or copper oxide fine particles, particularly, copper nano-particles with the surface oxide film layer or copper oxide nano-particles included in the pattern for wiring or the thin-film coating layer; and baking the copper fine particles, particularly the copper nano-particles resulted from said reducing treatment.

BACKGROUND ART

In the field related to the recent electronic equipment, a pattern for wiring on a plated printed circuit used therein becomes finer and finer. As for a metallic thin film layer used for forming various electrode patterns, growing progress is also made in application of the metallic thin film layer with an extremely thin film thickness. For instance, when attaining formation of a fine patter for wiring and a thin film by means of a screen printing method, increasing attempt is made in application of a dispersion of metallic fine particles with an extremely small particle diameter to the drawing of an ultra fine pattern or the formation of a thin-film coating layer with an extremely thin film-thickness. In the present, a dispersion of gold or silver fine particles, which is applicable to the above-described use, has been already commercialized.

Among them, as for a process for forming an ultra fine wiring pattern with the use of metallic nano-particles, for instance, a process scheme has been already established for the case where gold nano-particles or silver nano-particles are used. Specifically, formation of wiring with a wiring width and space between wires of 5 to 50 μm and a volume resistivity of $1 \times 10^{-5}$ Ω·cm can be made with a sintered product type of wiring layer obtained by drawing the extremely fine wiring pattern with the use of the dispersion for ultra fine printing containing the gold nano-particles or the silver nano-particles, and then sintering metallic nano-particles with each other. However, in the case where the gold nano-particles are employed, as gold itself of a material is expensive, a unit cost of the production of the dispersion for the ultra fine printing also becomes expensive, which is an economic bottleneck in wide spreading as a general purpose product. On the other hand, in the case where the silver nano-particles are used in place, the unit cost for the production of said dispersion can be considerably reduced, but as-the wiring width and the space between wires become narrow, such another serious problem as the breaking of a wire resulted from the event of electromigration comes up to the surface.

For the purpose of avoiding the breaking of the wire caused by the electromigration phenomenon, the application of a copper-based wiring is effective, and, for instance, the use of the copper-based material for the wiring pattern on a semiconductor device is widely studied as much higher integration is intended. Specifically, copper shows high electroconductivity similar to gold and silver, and has good ductility and malleability, but far lower electromigration is observed for copper in comparison with silver. Accordingly, when a fine wiring gives rise to the increased current density, use of the copper-based wiring can avoid the breaking of the wire caused by the electromigration phenomenon.

Hence, as for a plated printed circuit, when producing a fine wiring pattern with a sintered metallic wiring layer obtained by sintering metallic fine particles, for instance, metallic nano-particles with each other, it is desired to use copper, which shows little electromigration, as well. There are entertained great hopes for successful use of copper with the aim at reduction in cost for production of a plated printed circuit having a fine wiring pattern for wider spectra of purpose, as copper itself has far cheaper unit cost of the material in comparison with gold and silver.

Gold and silver, which are included in examples of noble metals, originally have such a feature that they may be hardly oxidized in comparison, so that when preparing the dispersion of fine particles, it is easy to keep the contained fine particles into the state of forming no oxide film on the surface. On the other hand, copper has such a feature that it may be easily oxidizable by comparison, so that when the dispersion of the fine particles has been prepared, the contained fine particles fall, in a short time, into such a state that they have an oxide film formed on their surfaces. Particularly, in the case of a copper nano-particle with a finer particle diameter, it has a relatively increased surface area, and has an oxide film with an increased thickness formed on its surface, and thus there are by no means few cases that most part of particle diameter of nanometric size is converted into the surface oxide film layer made of copper oxides.

DISCLOSURE OF THE INVENTION

When copper fine particles, for instance, copper nano-particles with particle diameters of 100 nm or smaller are used, as long as no surface oxide layer is present thereon, sintering of the nano-particle with each other can be attained by low-temperature heating in similar manner to the above described nano-particles made of gold or silver, and such a process can be applied to the production of a sintered product layer being superior in electroconductivity. However, in contrast to gold and silver of noble metals, copper tends to be easily oxidized, and the continued progress of oxidation is made from its surface to its inside. In addition, when copper has been processed into a state of fine powder such as nano-particles, copper easily forms bond with oxygen included in the atmosphere even at room temperature to film over with an oxide on its surface. The oxide of copper is hard to pin down to passivation state, and thus progress of oxidation is made toward the inside of the nano-particle, so that greater parts of the nano-particle finally become copper oxides after having been exposed to the air for a fixed time duration. Particularly, in the air including moisture, advance in oxidation from its surface to its inside of the copper nano-particle is accelerated.

The present inventors tried to prevent the oxidation of a copper nano-particle by using various methods, and confirmed that the thickness of the oxide film covering thereon could be reduced by, for instance, providing a molecular coating layer having a function of preventing coagulation on the surface of the copper nano-particle, and blocking its direct contact with the air, when dispersing the copper nano-particles in an organic solvent used as a dispersing solvent therefor. When a fine wiring pattern is drown by using a dispersion in which the copper nano-particles provided with the molecular coating layer having the function of preventing the coagulation on their surface are dispersed in the organic solvent, and then the organic solvent of the contained dispersing solvent is progressively removed by vaporization, the molecular coating layer on the surface is also released away, and accordingly progress of formation of the oxide film is made on the surface of the copper nano-particle that comes in contact with oxygen molecules in the atmosphere. As a result, we could not find means for completely preventing the surface oxidation. In addition, if the copper nano-particle has not been subjected to a treatment of preventing oxidation, in the duration that the dispersion having the copper nano-particles dispersed in the organic solvent is preserved, gradual progress of the formation of the oxide film on the surface of the copper nano-particle is advanced by the action of oxygen molecules dissolved in the organic solvent, while the dispersion having the copper nano-particles dispersed in the organic solvent is preserved, in final, it was converted to the copper nano-particle having a surface oxide film layer. Hence, the dispersion of copper fine particles that employs the copper nano-particles and is applicable to reproducible preparation of a fine wiring pattern with the use of a sintered product type of wiring layer that is obtained by sintering the copper nano-particles with each other, and which can replace the technique of forming a ultra fine wiring pattern by using a uniform dispersion containing the nano-particles of gold and silver of noble metals, has not yet reached practical levels under present circumstances. If the copper nano-particles are heated in a state of leaving an oxide film on the surface to carry out the treatment for sintering, the copper nano-particles are partially sintered with each other to construct a sintered product, but it remains in the state that thin layers of copper oxides are lying between the grain boundaries. Accordingly, formation of a dense pass for current flow is not achieved within the sintered product wholly, so that it was hard to prepare a fine wiring pattern having desired good electroconductivity in high reproducibility with the use thereof.

On the other hand, when carrying out such a process comprising the steps of adding a hydrogenating agent such as a boron hydride derivative to a dispersion containing the copper nano-particle having a surface oxide film in advance, applying the resultant dispersion onto a substrate and heating it up, copper oxides lying on the surface are reduced by reduction action due to the hydrogenated agent added thereto to recover copper in a non-oxidized state on the surface of the nano-particle. After having been converted into the non-oxidized state, progress in baking thereof is further made by heating to form a copper wiring layer of a sintered product type. In the case of using the technique, a hydrogenating agent blended in the dispersion such as a boron hydride derivative exhibits an adequate reducing action, but leaves a reaction by-product, which is taken into a sintered product layer. In some cases, it is necessary to adopt 400° C. or higher as the temperature of the reducing treatment. Such a substrate material as to endure said treatment temperature is limited to some heat-resistant materials such as ceramic, and particularly the unnecessary reaction by-product will be left in the sintered product. Therefore, there is no possibility that such a technique using the dispersion, in which the hydrogenating agent such as a boron hydride derivative is blended, will be widely applied.

In recent years, as for the solder material, an increased use of a tin alloy solder which does not contain lead, so-called a lead-free-solder is in progress, and in response to the high melting temperature of the lead-free-solder, use of a substrate material having adequate heat resistance to a temperature of about 300° C. is widely expanded, but more preferably, means for achieving adequate reducing reaction on copper nano-particles with a surface oxide film even at the reduction temperature reduced to 300° C. or lower is desired to be developed.

As explained above, the copper base wiring has such advantages that the material itself is inexpensive, and it may avoid the breaking of a wire due to electromigration or may alleviate a reduction/change in a thickness of a wiring layer even when applied to a high current density, so that an application of the copper base wiring to a conductor layer for a plated printed circuit having a fine wiring pattern is studied. In such a case, such a dispersion of copper fine particles with smaller particle diameters as to suite for drawing a fine pattern for wiring is required, and then because a surface oxide film layer covering the surface relatively increases with the decrease of the particle diameter, there is growing need for developing a technique for reducing the surface oxide film layer to produce a copper wiring layer of a sintered product type showing excellent electroconductivity. In addition, in the case of the copper fine particle with a finer average diameter, oxidation is advanced from the surface to the inside so as to convert the most parts of the particle into the copper oxides, and whereby it may turn into the particle equivalent to a fine particle made of copper oxides. Accordingly, as for such a copper oxide fine particle, in place of the copper fine particle having the surface oxide film layer, it becomes necessary to develop the technique for preparation of a copper wiring layer of a sintered product type showing good electroconductivity, through the process wherein the coating layer that is drown in the shape of fine pattern for wiring by using the dispersion thereof is subjected to rapid reduction at a low temperature to recover a cupper fine particle, and then said cupper fine particle is sintered with each other closely.

The present invention solves the above described problems, and the aim of the present invention is directed at providing: a process for forming a fine-shaped conductor of a sintered product type of copper fine particles, wherein a dispersion of copper fine particles with a surface oxide film layer or copper oxide fine particles is employed for drawing a fine pattern for wiring or for forming a thin coating film, when forming a fine copper-based wiring pattern or a copper thin-film layer with an extremely thin film thickness, in which copper, which is inexpensive and low in the risk of electromigration, is used for an electroconductive medium thereof; as for the copper fine particles with the surface oxide film layer or copper oxide fine particles contained in said dispersion-coated layer, under heating condition at 350° C. or lower, or preferably under heating condition at 300° C. or lower, the copper oxide layer coating on the surface thereof is subjected to the treatment of sufficient reduction; and treatment for sintering the resultant copper fine particles closely with each other can be carried out with ease and high reproducibility: and a process for forming a fine copper-based wiring pattern made of the sintered product, or a copper thin-film layer having an extremely thin film thickness by applying the aforementioned process. In the case of such a nano-particle with an average diameter of 100 nm or smaller, for instance, an average diameter of about 1 to 20 nm, which is suitable for drawing an extremely fine wiring pattern, a copper-oxide layer coating on its surface reaches up to a half or more of said average particle diameter, and some amount of copper in a non-oxidized state slightly remains in a center as a nucleus, and thus it reaches a state assumed to be nano-particles of copper oxides, as a whole. If it is such a case, the aim of the present invention is directed at providing: a process for forming a fine pattern of a copper base wiring made of the sintered product, in which, at a heating condition of 350° C. or lower, and preferably at a heating condition of 300° C. or lower, the treatment of sufficient reduction can be performed; and the treatment for sintering the resultant copper fine particles closely with each other can be carried out. In addition, the aim of the present invention is directed at providing: a process for forming a fine-shaped conductor of a sintered product type of copper fine particles, wherein, even in such a case where not only the nano-particles with the average diameter of 100 nm or smaller, but also the copper fine particles having the surface oxide film layer or the copper oxide fine particles with the average diameter of about several micrometers are used therefor, under heating condition at 350° C. or lower, or preferably under heating condition at 300° C. or lower, the copper oxide layer coating on the surface thereof is subjected to the treatment of sufficient reduction; and treatment for sintering the resultant copper fine particles closely with each other can be carried out with ease and high reproducibility: and a process for forming a fine copper-based wiring pattern made of the sintered product, or a copper thin-film layer having an extremely thin film thickness by applying the aforementioned process.

In order to solve the above described problems, the present inventors made an extensive investigate on a technique in which, at first, a dispersion is applied onto a substrate, and then treatment for effectively reducing a copper oxide film layer that covers on the surface of a copper nano-particle contained in the coated layer. In course of study, we found that in the case of a nano-particle with an average diameter, for instance, of about 1 to 20 nm, the layer thickness of the surface coating layer may often reach up to a half or more of the average diameter of the fine particles, and accordingly a ratio of the copper oxides occupying in total nano-particles may come into high level, and as a result, when using the technique of in advance blending an inorganic hydrogenating agent such as sodium tetrahydroborate (sodium borohydride) in the dispersion, there are some cases where the hydrogenating agent of an amount required to reduction could not be supplied to each portion. As a result of further investigating the means on the basis of such findings, we conceived that a technique in which, after the formation of the coating layer, reactive species that are involved in the reduction reaction is supplied in a vapor form to act thereon, would be more suitable for completing a desired reduction reaction without depending on an average diameter of a nano-particle. We found that it is preferable that, in the above technique, an oxygen-containing compound itself that was a by-product resulting from the above described reduction reaction could be removed by vaporization, and thereby it did not remain in the coating layer, and besides, that the reactive species themselves that were involved in the reduction reaction were in a vapor state and could pass through a narrow gap between densely-layered nano-particles to reach a deeper part thereof.

In addition, the present inventors found that when using a vapor of an organic compound having reducibility such as alcohols, a copper oxide film layer on the surface of a nano-particle can be reduced by a thermal reduction reaction, and the reduction reaction can progress with sufficient reaction rate, for instance, even at 300° C. or lower. In addition, we confirmed that an organic compound having reducibility such as alcohols was melted into a liquid state, further vaporized into vapor at a treatment temperature for said thermal reduction reaction, and the vapor could pass through the narrow gap between densely-layered nano-particles to reach even a deeper part thereof. On the other hand, we found that by the way of a solid phase reaction between the copper atom of the non-oxidized state that is formed on the surface by the reduction reaction and the copper oxide molecule existing inside, the internal copper oxide was converted to a copper atom of a non-oxidized state, instead, copper oxide was formed on the surface, consequently the copper oxide film layer was gradually reduced, and finally thereby the whole nano-particle was recovered to be the copper nano-particle. It was also confirmed that when copper nano-particles free from an oxide film on the surface contacted with each other, sintering promptly progressed even at a comparatively low temperature to form a dense sintered product layer of the copper nano-particles from the whole coated layer. On the other hand, it was confirmed that as both an organic compound having reducibility which had entered into the narrow gap between nano-particles and an oxidized reaction product itself that was by-produced from the organic compound were fluid, both were promptly pushed out onto the surface layer of a sintered product layer with the advance of a sintering reaction, and accordingly they were not a factor of inhibiting formation of the tightly sintered structure within the resultant sintered product layer.

In addition to the above described findings, the present inventors also verified that the whole obtained sintered product layer could be formed in uniform and dense sintered structure with ease and high reproducibility, as the sintering of produced copper nano-particles progressed in the presence of said organic compound having reducing activity, and accomplished a process for forming a fine copper-based wiring pattern of a product layer consisting of the copper nano-particles sintered with each other, according to the first aspect of the present invention.

Furthermore, the present inventors found that in the case of a copper fine particle having a surface oxide film layer or a copper oxide fine particle with an average particle diameter of sub-micrometers to several micrometers, when heat treatment was conducted while a vapor of an organic compound having reducibility was supplied in vapor phase, the copper-oxide film layer on the surface was reduced, and the reduction reaction progressed at 350° C. or lower with a sufficient reaction rate, and thereby the copper fine particle substantially having no surface oxide film layer was recovered therefrom. On the other hand, it came out that in contrast to copper nano-particles with an average diameter of 100 nm or smaller, in the case of the resultant copper fine particles with an average diameter of about several micrometers, formation of a uniform and dense sintered product layer could not be attained easily by continued heating-up under a reducing atmosphere at a temperature of 350° C. or lower. The present inventors further continued investigation and found that in the case of the copper fine particles with the average diameter of sub-micrometers to several micrometers that were resulted from the reducing treatment, a uniform and dense sintered product layer could be formed therefrom even at a temperature of 350° C. or lower by repeatedly performing a combined treatment of oxidation/re-reduction at least one time, which comprised of treatment for surface oxidization wherein heat-treatment therefor was conducted for 30 seconds or shorter under an atmosphere containing oxygen to give rise of the action of oxygen on the copper fine particles, and treatment for re-reduction wherein, next to the surface oxidization treatment, heat-treatment was conducted for 30 seconds or longer and 300 seconds or shorter under an atmosphere containing the gas or the vapor of the compound having reducibility to give rise of the action of said compound having reducibility on the copper fine particles, which just underwent the surface oxidization treatment, and the reproducibility thereof was high. It was also confirmed that the technique wherein the combined treatment of oxidation/re-reduction was repeatedly conducted at least one time could be applied to the copper nano-particles with an average diameter of 100 nm or smaller in quite similar manner to the copper fine particles with the average diameter of several micrometers, and in addition, that the technique provided a fine-shaped conductor of a sintered product of copper fine particles, which had more excellent electric conductivity than the sintered product layer of the copper nano-particles obtained by continued heating-up under a reductive atmosphere at 350° C. or lower. Process for forming a fine copper-based wiring pattern made of a product layer made of copper fine particles sintered with each other according to the second aspect of the present invention was completed by gathering up a series of the above described findings.

That is to say, a process for forming the fine copper-based wiring pattern according to the first aspect of the present invention is A process for forming a copper-based fine pattern of plated circuit made of a sintered product layer of copper nano-particles sintered with each other on a substrate, which process for formation of the copper-based fine pattern of plated circuit comprises the steps of:

drawing a coated layer having the fine pattern for wiring on the substrate by using a dispersion containing the copper nano-particles with a surface oxide film layer or copper oxide nano-particles having an average particle diameter selected from a range of 1 to 100 nm, and subjecting the copper nano-particles with the surface oxide film layer or the copper oxide nano-particles contained in the coated layer to the treatment for reducing the surface oxide film layer or copper oxides, and further baking the resultant nano-particles that recovered under the reducing treatment to form a sintered product layer thereof, wherein said reducing treatment and the baking treatment that is carried out in the same step is conducted by heating the copper nano-particles with the surface oxide film layer or the copper oxide nano-particles contained in the coated layer in the presence of an organic compound having reducibility at a heating temperature selected from 300° C. or lower to give rise to the action of said organic compound having reducibility thereon.

In that case, it is preferred that, in the copper nano-particle with the surface oxide film layer contained in the dispersion, at least said surface oxide film layer comprises cuprous oxide, cupric oxide or the mixture of the copper oxides, and the nano-particle is a particle in the shape of mixture containing two or more out of cuprous oxide, cupric oxide or the mixture of the copper oxides, and metallic copper.

On the other hand, said organic compound having reducibility to be present in the reducing treatment is preferably an organic compound having a hydroxyl group that is transformable to an oxo group (=O) or a formyl group (—CHO) by oxidation, or a mixture containing two or more types of the compounds.

Preferred examples of the organic compound having reducibility to be present in the reducing treatment include an organic compound having an alcoholic hydroxyl group, or a mixture containing two or more types of the compounds. Furthermore, more preferred examples of the organic compounds having reducibility to be present in the reducing treatment include an organic compound having two or more hydroxyl groups, or a mixture containing two or more types of the compounds. In particular, the organic compound having reducibility to be present in said reducing treatment is further preferably glycerin (1,2,3-propanetriol).

In addition, in a process for forming a fine copper-based wiring pattern according to the first aspect of the present invention, at least one organic compound having reducibility to be present in the reducing treatment may be blended in a dispersion containing the copper nano-particle with the surface oxide film layer or the copper oxide nano-particle. Alternatively, in the step of said reducing treatment, at least one organic compound having reducibility to be present in the reducing treatment may be vaporized to act on the coated layer having the fine pattern for wiring, in vapor phase as a vapor of the organic compound having reducibility.

In addition, it is desired that in the coated layer having the fine wiring pattern drawn on a substrate, a minimum width of the wiring for the wiring pattern is selected from a range of 0.5 to 200 μm, and correspondingly a minimum space between wires is selected from a range of 0.5 to 200 μm, and the average particle diameter of the copper nano-particles with the surface oxide film layer or the copper oxide nano-particles contained in dispersion is selected from the values of 1/10 or less of the minimum width of wiring and the minimum space between the wires.

Besides, a technique for drawing the coated layer having the fine pattern for wiring on the substrate may be selected from drawing techniques including a screen-printing method, an ink-jet method and a transferring method.

Further, a process for forming a copper thin-film according to the first aspect of the present invention is A process for forming a copper thin layer composed of a product layer of copper nano-particles sintered with each other on a substrate, which process for the formation of the copper thin layer comprises the steps of:

drawing a coated layer having the pattern for said copper thin-film layer on the substrate by using a dispersion containing the copper nano-particles with a surface oxide film layer or copper oxide nano-particles having an average particle diameter selected from a range of 1 to 100 nm, and subjecting the copper nano-particles with the surface oxide film layer or the copper oxide nano-particles contained in the coated layer to the treatment for reducing the surface oxide film layer or copper oxides, and further baking the resultant nano-particles that recovered under the reducing treatment to form a sintered product layer thereof, wherein said reducing treatment and the baking treatment that is carried out in the same step is conducted by heating the copper nano-particles with the surface oxide film layer or the copper oxide nano-particles contained in the coated layer in the presence of an organic compound having reducibility at a heating temperature selected from 300° C. or lower to give rise to the action of said organic compound having reducibility thereon.

In that case, it is preferred that, in the copper nano-particle with the surface oxide film layer contained in the dispersion, at least said surface oxide film layer comprises cuprous oxide, cupric oxide or the mixture of the copper oxides, and the nano-particle is a particle in the shape of mixture containing two or more out of cuprous oxide, cupric oxide or the mixture of the copper oxides, and metallic copper.

On the other hand, said organic compound having reducibility to be present in the reducing treatment is preferably an organic compound having a hydroxyl group that is transformable to an oxo group (=O) or a formyl group (—CHO) by oxidation, or a mixture containing two or more types thereof.

Preferred examples of the organic compounds having reducibility to be present in the reducing treatment include an organic compound having an alcoholic hydroxyl group, or a mixture containing two or more types of the compounds. Furthermore, more preferred examples of the organic compounds having reducibility to be present in the reducing treatment include an organic compound having two or more hydroxyl groups, or a mixture containing two or more types thereof. In particular, said organic compound having reducibility to be present in the reducing treatment is further preferably glycerin (1,2,3-propanetriol).

In addition, in a process for forming a copper thin-film film according to the first aspect of the present invention, at least one organic compound having reducibility to be present in the reducing treatment may be blended in a dispersion containing the copper nano-particle with the surface oxide film layer or the copper oxide nano-particle. Alternatively, in the step of the reducing treatment, at least one organic compound having reducibility to be present in the reducing treatment may be vaporized to act on the coated layer having the fine pattern for wiring, in vapor phase as a vapor of the organic compound having reducibility.

In addition, it is preferred that, in the copper thin-film pattern drawn on a substrate, a minimum thickness of the copper thin film is selected from a range of 0.1 to 20 μm, and the average particle diameter of the copper nano-particles with the surface oxide film layer or the copper oxide nano-particles contained in dispersion is selected from the values of 1/10 or less of the minimum thickness thereof.

Besides, a technique for drawing the coated layer having the pattern for the copper thin film on the substrate may be selected from drawing techniques including a screen-printing method and a transferring method, or a spin coat method.

In the process for forming a fine copper-based wiring pattern as well as the process for a copper thin film according to the first aspect of the present invention described above, for a fine wiring pattern or a coating film pattern, which are drawn with the use of a dispersion containing copper nano-particles having an oxide film layer on its surface or copper oxide nano-particles which are in advanced stage of oxidation expanded into the whole particles, the nano-particles in a dispersion-coated layer are heated at 300° C. or lower in the presence of an organic compound having reducibility to reduce the oxide film covering thereon by means of the reduction reaction using the organic compound having reducibility as a reducing agent, and thereby the cupper nano-particles are recovered therefrom; as a result, formation of the product layer made of the resultant copper nano-particles sintered with each other can be achieved in the same heating step. The reduction of the copper oxide covering film layer by using the organic compound having reducibility as the reducing agent progresses at a sufficient reaction rate even at a low temperature of 300° C. or lower, and then the sintering of the recovered copper nano-particles with each other is as well executed coincidentally in the presence of said organic compound having reducibility, so that after the reduction treatment, re-oxidation of the active surface of the copper nano-particle can be avoided. The heat treatment can be performed at the low temperature of 300° C. or lower, so that heat resistance required to a substrate material to be used is greatly alleviated, which is an advantage in greatly widening a spectrum of application. In addition, with respect to the obtained fine copper-based wiring, as copper itself is a conductive material being low in the risk of electromigration, the occurrence of the decrease of a wiring thickness or the breaking of a wire due to the electromigration can be inhibited for the fine wiring patter described above. Furthermore, both of the used organic compound having reducibility and a reaction product which is by-produced from the organic compound in the reducing treatment are finally evaporated or gasified by heating, and as a result, there is a further advantage that they do not remain in the resultant fine copper-based wiring layer of a sintered product type or in the copper thin-film layer with an extremely thin film thickness.

Furthermore, a process for forming a fine-shaped conductor of sintered product type of copper fine particles according to the second aspect of the present invention is A process for forming a fine-shaped conductor of sintered product type of copper fine particles, which is composed of a sintered product layer of the copper fine particles being shaped into a predetermined plane-view pattern with a thin film thickness, wherein in said sintered product layer of the copper fine particles to be formed, the minimum film thickness is selected from a range of 0.1 to 20 μm, the maximum film thickness is selected from a range of 100 μm or smaller, and the minimum width for the wiring of the plane-view pattern is selected from a range of 0.5 to 200 μm, and said process for formation of the fine-shaped conductor of sintered product type of copper fine particles comprises the steps of:

with use of a dispersion containing the copper fine particles with a surface oxide film layer or copper oxide fine particles, of which an average particle diameter is selected, at least from a range of 10 μm or less, within ¼ of said minimum film thickness and within 1/10 of said minimum wiring width of the sintered product layer to be formed, drawing a coated layer by applying the dispersion into the predetermined plane-view pattern for said conductive member, and subjecting the copper fine particles with the surface oxide film layer or the copper oxide fine particles contained in the coated layer to the treatment for reducing the surface oxide film layer or copper oxides, and further baking the resultant fine particles that recovered under the reducing treatment to form a sintered product layer thereof, wherein said reducing treatment and the baking treatment are carried out through following two steps that are executed sequentially in the same process at a heating temperature selected from 350° C. or lower:

the first treatment step of heating the copper fine particles with the surface oxide film layer or the copper oxide fine particles contained in the coated layer for duration of 1 min. to 15 min. in the presence of an organic compound having reducibility to give rise to the action of said organic compound having reducibility thereon, and thereby reducing the copper fine particles with the surface oxide film layer or the copper oxides composing the copper oxide fine particles to recover copper fine particles; and the second treatment step of subjecting said copper fine particles, which are obtained as a result of performance of the first treatment step, to a combined treatment of oxidation/reduction at least one time, which consists of an stage of subjecting the copper fine particles to the treatment for surface oxidization by heating for 30 seconds or shorter under an atmosphere containing oxygen to give rise of the action of oxygen thereon, and next to the surface oxidization treatment, an stage of subjecting the copper fine particles, which just underwent the surface oxidization treatment, to the treatment for re-reduction by heating the particles for 30 seconds or longer and 300 seconds or shorter under an atmosphere containing the gas or the vapor of said compound having reducibility to give rise of the action of said compound having reducibility thereon.

In addition, a process for forming the fine copper-based wiring pattern according to the second aspect of the present invention is provided as a mode of applying the above described process for forming a fine-shaped conductor of sintered product type of copper fine particles according to the second aspect of the present invention to formation of the fine copper-based wiring pattern made of a product layer consisting of copper fine particles sintered with each other on a substrate. That is to say, the process for forming the fine copper-based wiring pattern according to the second aspect of the present invention is a process for forming a fine copper-based wiring pattern made of a product layer consisting of copper fine particles sintered with each other on a substrate, wherein the process for formation of the fine pattern of copper-based wiring comprises the steps of:

drawing a coated layer for said fine wiring pattern on the substrate by using a dispersion containing the copper fine particles with a surface oxide film layer or copper oxide fine particles having an average particle diameter selected at least from a range of 10 µm or less, and subjecting the copper fine particles with the surface oxide film layer or the copper oxide fine particles contained in the coated layer to the treatment for reducing the surface oxide film layer or copper oxides, and further baking the resultant fine particles that recovered under the reducing treatment to form a sintered product layer of the copper fine particles, wherein said reducing treatment and the baking treatment are carried out through following two steps that are executed sequentially in the same process at a heating temperature selected from 350° C. or lower:

the first treatment step of heating the copper fine particles with the surface oxide film layer or the copper oxide fine particles contained in the coated layer for duration of 1 min. to 15 min. in the presence of an organic compound having reducibility to give rise to the action of said organic compound having reducibility thereon, and thereby reducing the copper fine particles with the surface oxide film layer or the copper oxides composing the copper oxide fine particles to recover copper fine particles; and the second treatment step of subjecting said copper fine particles, which are obtained as a result of performance of the first treatment step, to a combined treatment of oxidation/re-reduction at least one time, which consists of an stage of subjecting the copper fine particles to the treatment for surface oxidization by heating for 30 seconds or shorter under an atmosphere containing oxygen to give rise of the action of oxygen thereon, and next to the surface oxidization treatment, an stage of subjecting the copper fine particles, which just underwent the surface oxidization treatment, to the treatment for re-reduction by heating the particles for 30 seconds or longer and 300 seconds or shorter under an atmosphere containing the gas or the vapor of said compound having reducibility to give rise of the action of said compound having reducibility thereon.

In addition, the process for forming the copper thin film according to the second aspect of the present invention is provided in a mode of applying the above described process for forming a fine-shaped conductor of sintered product type of copper fine particles according to the second aspect of the present invention to formation of the copper thin-film layer made of a product layer composed of copper fine particles sintered with each other on a substrate. That is to say, the process for forming the copper thin film according to the second aspect of the present invention is a process for forming a copper thin-film layer made of a product layer composed of copper fine particles sintered with each other on a substrate, wherein the process for formation of the copper thin-film layer comprises the steps of:

drawing a coated layer for said copper thin-film layer on the substrate by using a dispersion containing the copper fine particles with a surface oxide film layer or copper oxide fine particles having an average particle diameter selected at least from a range of 10 µm or less, and subjecting the copper fine particles with the surface oxide film layer or the copper oxide fine particles contained in the coated layer to the treatment for reducing the surface oxide film layer or copper oxides, and further baking the resultant fine particles that recovered under the reducing treatment to form a sintered product layer of the copper fine particles, wherein said reducing treatment and the baking treatment are carried out through following two steps that are executed sequentially in the same process at a heating temperature selected from 350° C. or lower:

the first treatment step of heating the copper fine particles with the surface oxide film layer or the copper oxide fine particles contained in the coated layer for duration of 1 min. to 15 min. in the presence of an organic compound having reducibility to give rise to the action of said organic compound having reducibility thereon, and thereby reducing the copper fine particles with the surface oxide film layer or the copper oxides composing the copper oxide fine particles to recover copper fine particles; and the second treatment step of subjecting said copper fine particles, which are obtained as a result of performance of the first treatment step, to a combined treatment of oxidation/re-reduction at least one time, which consists of an stage of subjecting the copper fine particles to the treatment for surface oxidization by heating for 30 seconds or shorter under an atmosphere containing oxygen to give rise of the action of oxygen thereon, and next to the surface oxidization treatment, an stage of subjecting the copper fine particles, which just underwent the surface oxidization treatment, to the treatment for re-reduction by heating the particles for 30 seconds or longer and 300 seconds or shorter under an atmosphere containing the gas or the vapor of said compound having reducibility to give rise of the action of said compound having reducibility thereon.

In the afore-mentioned process for forming a fine-shaped conductor of sintered product type of copper fine particles according to the second aspect of the present invention, in the copper fine particle with the surface oxide film layer contained in the dispersion, at least said surface oxide film layer may comprise cuprous oxide, cupric oxide or the mixture of the copper oxides, and the fine particle may be a particle in the shape of mixture containing two or more out of cuprous oxide, cupric oxide or the mixture of the copper oxides, and metallic copper.

Further, in the process for forming a fine-shaped conductor of sintered product type of copper fine particles according to the second aspect of the present invention, said organic compound having reducibility to be present in the atmosphere as a gas or a vapor for said first treatment step and the treatment of re-reduction of said second treatment step in the reducing treatment and baking treatment is preferably an organic compound having a hydroxyl group that is transformable to an oxo group (=O) or a formyl group (—CHO) by oxidation, or a mixture containing two or more types thereof. Alternatively, said organic compound having reducibility to be present in the atmosphere as a gas or a vapor for said first treatment step and the treatment of re-reduction of said second treatment step in the reducing treatment and baking treatment is preferably a polyvalent alcohol compound having two or more hydroxyl groups in a molecule, or a mixture containing two or more types thereof. Further, said organic compound having reducibility to be present in the atmosphere as a gas or a vapor for said first treatment step and the treatment of re-reduction of said second treatment step in the reducing treatment and baking treatment may be a hydrogen molecule.

Among them, more preferable embodiments include such a mode in which said organic compound having reducibility to be present in the atmosphere as a gas or a vapor for said first treatment step and the treatment of re-reduction of said second treatment step in the reducing treatment and baking treatment is any one of glycerin (1,2,3-propanetriol), ethylene glycol (1,2-ethanediol), propylene glycol (1,2-propanediol) and 1,3-propanediol.

On the other hand, a dispersing solvent contained in a dispersion containing the copper fine particles with the surface oxide film layer or the copper oxide fine particles may be an alcoholic compound having a melting point of 10° C. or lower, and a hydroxyl group which is transformable to an oxo group (=O) or a formyl group (—CHO) by oxidation.

In the process for forming a fine-shaped conductor of sintered product type of copper fine particles according to the second aspect of the present invention, as well as the process for forming a fine copper-based wiring pattern or the process for forming a copper thin film by applying the process thereto, for a fine wiring pattern or a coating film pattern, which are drawn with the use of a dispersion containing copper fine particles having an oxide film layer on its surface or copper oxide fine particles which are in advanced stage of oxidation expanded into the whole particles, the fine particles in a dispersion-coated layer are heated at 350° C. or lower in the presence of an organic compound having reducibility to reduce the oxide film covering thereon by means of the reduction reaction using the organic compound having reducibility as a reducing agent, and thereby the cupper fine particles can be recovered therefrom; after that, such heat treatment combining oxidation treatment and re-reducing treatment, in which, in the same heating-up condition, oxidation treatment is conducted by exposing the particles to the atmosphere containing oxygen for a short time and then re-reducing treatment is carried out under the atmosphere containing the vapor and gas of a compound having reducibility, are repeatedly performed; as a result, formation of the product layer made of the resultant copper nano-particles sintered with each other can be achieved in the same heating step with high reproducibility. The reduction of the copper oxide covering film layer by using the organic compound having reducibility as the reducing agent progresses at a sufficient reaction rate even at a low temperature of 350° C. or lower, and as for the sintering of the copper nano-particles produced thereby, the sintered product layer in which the copper fine particles are sintered with each other can be formed at a remarkably high yield and high reproducibility by using the technique wherein said heat treatment combining oxidation treatment and re-reduction treatment is repeatedly performed, in comparison with the technique wherein continued heating is performed under an atmosphere containing a vapor and a gas of a compound having reducibility. The heat treatment can be performed at the low temperature of 350° C. or lower, so that heat resistance required to a substrate material to be used is greatly alleviated, which is an advantage in greatly widening a spectrum of application. In addition, with respect to the obtained fine copper-based wiring, as copper itself is a conductive material being low in the risk of electromigration, the occurrence of the decrease of a wiring thickness or the breaking of a wire due to the electromigration can be inhibited for the fine wiring patter described above. Furthermore, as a vapor or a gas of the compound having reducibility to be used therein is supplied from vapor phase, there is a further advantage that an aimed fine-shaped conductor of sintered product type of copper fine particles can be produced without depending on a shape, a size or a positional arrangement of a fine copper-based wiring layer of sintered product type or a copper thin-film layer with an extremely thin film thickness to be targeted for production.

Figure 1:
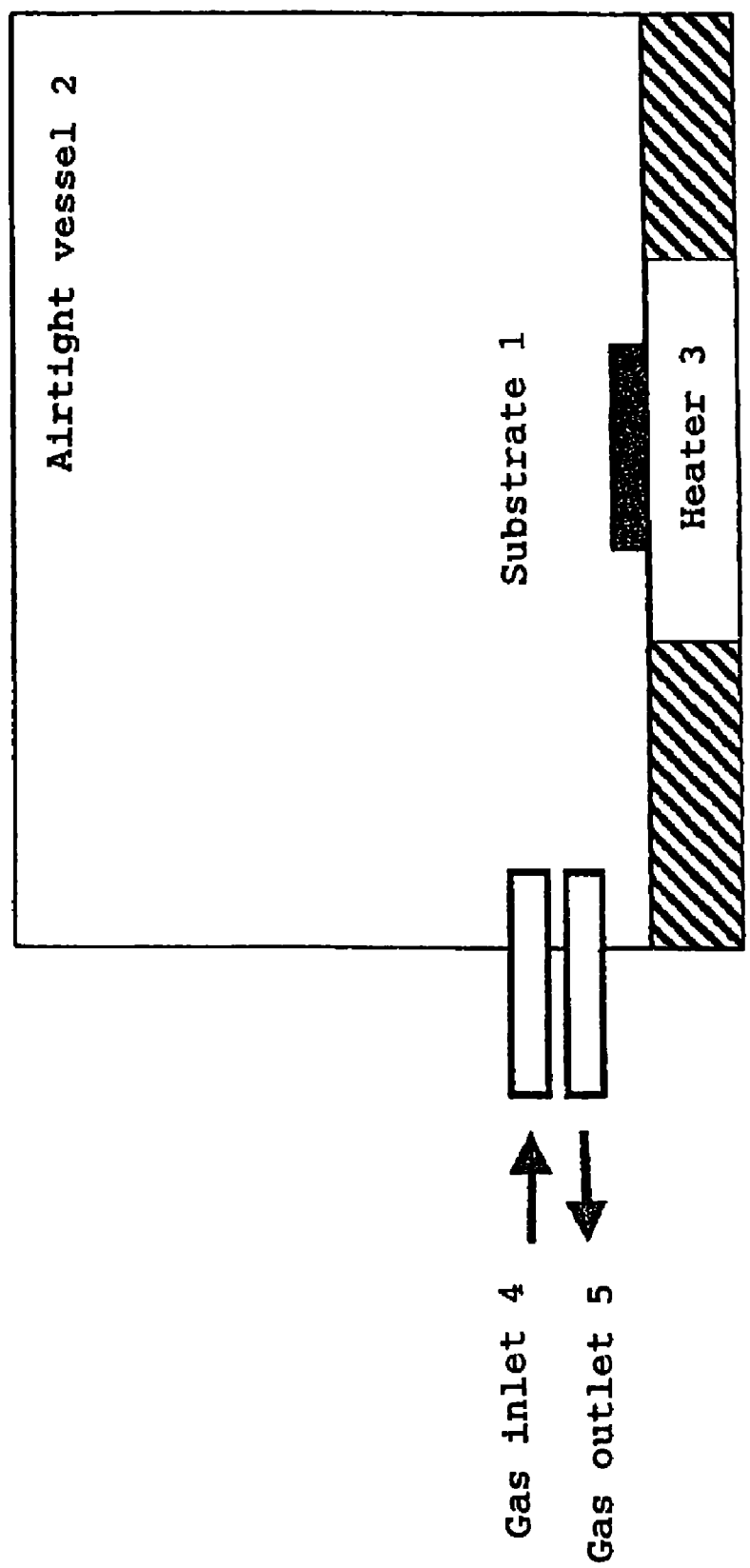
FIG. 1 is a view schematically showing a constitution of an apparatus for sintering/reduction treatment with the use of a reducible organic compound, which is employable to conduct out a reducing/sintering treatment step in a process for forming a fine wiring pattern made of a copper-based sintered product according to the first aspect of the present invention.
Figure 2:
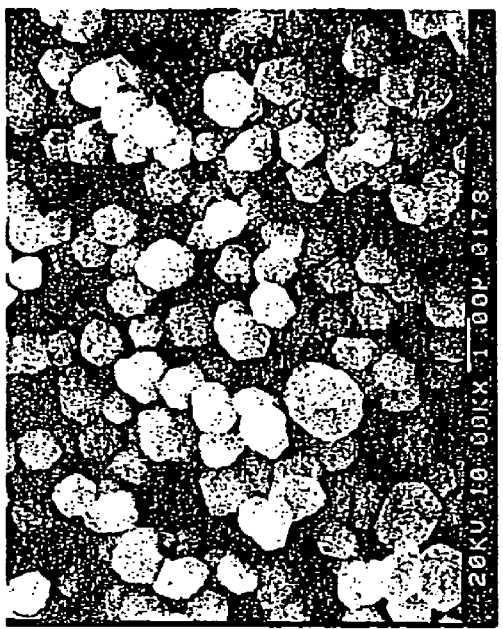
FIG. 2 is a view showing a result observed with an SEM on a state of copper fine particles cohering with each other, in a sintered product layer that was produced by a process for forming a sintered product layer of copper fine particles according to the second aspect of the present invention.
Figure 2:
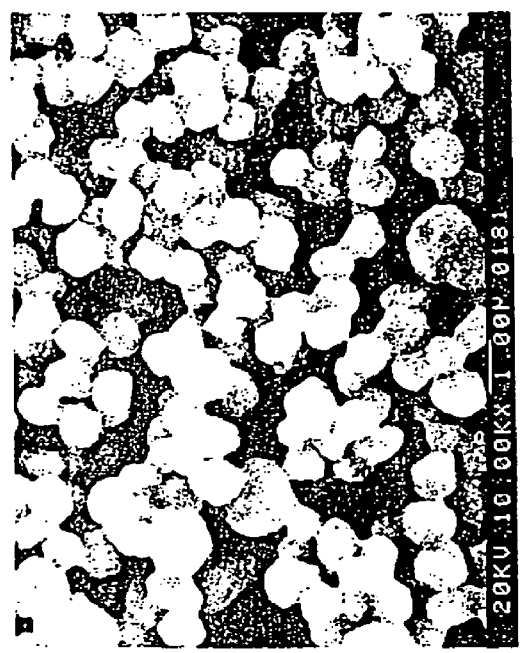

Furthermore, each mark put in FIG. 1 means the following articles.

1: substrate,
2: airtight vessel used for reducing/sintering treatment apparatus,
3: heater used for heating-up at the step of reducing/sintering treatment,
4: gas inlet,
5: gas outlet

BEST MODE FOR CARRYING OUT THE INVENTION

The First Aspect of the Present Invention

In the case of the process for forming a fine wiring pattern made of a copper-based sintered product according to the first aspect of the present invention, considering that copper nano-particles are extremely apt to be oxidized in contrast to metallic nano-particles of gold and silver which are noble metals, and that there is no means for completely preventing the oxidation, a copper-based wiring pattern that is inexpensive and low in the risk of electromigration is formed through such a process that a dispersion of nano-particles having a copper oxide coating layer on the surface or copper oxide nano-particles is prepared, and a desired wiring pattern on the substrate is drawn with the use of said dispersion of the nano-particles, and then the copper oxide coating layer that is present on the surface of the nano-particle is reduced to recover the copper nano-particles therefrom, and treatment for baking them is conducted to form a layer of dense sintered product made of the copper nano-particles sintered with each other in the coating layer.

Particularly, in the process for forming a fine copper-based wiring pattern as well as the process for forming a copper thin film, according to the first aspect of the present invention, in the step of reducing a copper oxide film layer being present on the surfaces of nano-particles or the copper oxide nano-particles, heat-treatment therefor is conducted in the presence of an organic compound having reducibility at a heating temperature selected from 300° C. or lower, whereby the organic compound having reducibility act, as a reducing agent, on the copper oxides on the surface of the nano-particles that contained in the coating layer, and thereby reduction reaction for the copper oxide on the surface can progress quickly even at as low a heating temperature as 300° C. or lower. Through a solid phase reaction between the copper atom of in a non-oxidized state that is once produced on the surface and the copper oxide molecule being present inside, the copper oxide being present inside is converted to a copper atom in the non-oxidized state, and in place, an copper oxide is formed on the surface. After that, the copper oxide formed on the surface is reduced again to a copper atom in the non-oxidized state by the reducing action of the organic compound having reducibility, which is continuously supplied. As a result of the repetition of a series of the above described reaction cycle, the copper oxide film layer which has initially reached a deep part of the nano-particle is gradually reduced, and finally, the whole nano-particle is turned into nano-particle of copper.

If the recovered copper nano-particle is contacted again with an oxygen molecule in the atmosphere or the like, surface oxidation rapidly occurs, but in the process for forming the fine copper-based wiring pattern according to the first aspect of the present invention, the copper nano-particles that are recovered are kept in such a state that the clean surfaces thereof are in close contact with each other, at such a heating temperature selected from a range of no lower than room temperature (25° C.) and no higher than 300° C. in the presence of the organic compound having reducibility, and escape being contacted again with the air, and as a result, sintering is quickly advanced at such a comparatively low temperature to form a dense sintered product layer made of the copper nano-particles from the whole coating layer.

Accordingly, in the process for forming the fine copper-based wiring pattern according to the first aspect of the present invention, it is desired that an average particle diameter of nano-particles to be used therein is selected within such a range that sintering can progress quickly, even at a heating temperature selected from the range of no lower than room temperature (25° C.) and no higher than 300° C., in the state that the clean surfaces of the copper nano-particles recovered come into close contact with each other, in final. From this viewpoint, the average particle diameter of the nano-particles having the copper oxide film layer on the surface to be used therefor is selected preferably from a range of 1 to 100 nm, and more preferably 1 to 20 nm. Furthermore, the process for forming the fine wiring pattern according to the first aspect of the present invention utilizes a copper-based wiring made of the sintered product, at first, for the purpose of avoiding the breaking of a wire caused from the electromigration phenomenon, which is most remarkably found in a part having the minimum wiring width in the case of formation of extremely fine wiring pattern, and in particular, it is more preferable process for such a case in which the minimum wiring width of the wiring pattern is chosen within a range of 0.5 to 200 μm, and practically within a range of 5 to 50 μm, and correspondingly the minimum space between wires is chosen within a range of 0.5 to 200 μm, and practically, within a range of 5 to 50 μm. When drawing the above described extremely fine wiring pattern with high uniformity for wiring width by using a dispersion of nano-particles, it is desired that the average particle diameter of nano-particles to be used is selected from a range of 1/10 or less values of the aimed minimum wiring width and the minimum space between wires. Simultaneously, the thickness of a wiring layer of a copper-sintered product is appropriately determined in response to the minimum wiring width, and normally, in such a shape that the layer thickness of the wiring layer is significantly small in comparison with the minimum wiring width, and in such a case, variations in the layer thickness of the wiring layer and the non-uniformity of a local height can be suppressed by selecting the average particle diameter of the nano-particles from a range of 1 to 100 nm, and preferably from a range of 1 to 20 nm.

On the other hand, as for a technique for drawing a desired wiring pattern on a substrate with the use of the dispersion containing the nano-particles, any drawing technique of screen printing, ink jet printing and decalcomania printing, which are conventionally used for forming a fine wiring pattern by using the dispersion containing metallic nano-particles, can be applicable as well. Specifically, it is desired that a more suitable technique is selected from the screen printing, the ink jet printing or the decalcomania printing, in consideration of the shape of the fine wiring pattern, the minimum wiring width and the layer thickness of the wiring layer to be targeted.

On the other hand, it is desired that the dispersion containing the nano-particles to be used is prepared so as to obtain each suitable liquid viscosity in response to an adopted drawing technique. For instance, when the screen printing is used for drawing the fine wiring pattern, it is desired that the liquid viscosity is selected from a range of 30 to 300 Pa·s (25° C.) for the dispersion containing the nano-particles. In addition, when the decalcomania printing is used, it is desired that the liquid viscosity therefor is selected from a range of 3 to 300 Pa·s (25° C.). When the ink jet printing is used, it is desired that the liquid viscosity therefor is selected from a range of 1 to 100 mPa·s (25° C.). The liquid viscosity of the dispersion containing the nano-particles is varied depending on an average particle diameter and dispersion concentration of nano-particles to be used, and a type of a used dispersing solvent, and thus the liquid viscosity can be adjusted to an aimed value by appropriately selecting the above-described three factors.

As for the nano-particle having a copper oxide film layer on its surface, as long as its average particle diameter is adjusted within the above-described range and is beforehand ascertained, there is no limit to the production method thereof. For instance, it is possible to use a copper nano-particle having a copper oxide film layer formed on the surface, or the whole nano-particle made of copper oxides. Accordingly, as for the nano-particle having the copper oxide film layer on its surface, at least the copper oxide film layer is comprising of cuprous oxide, cupric oxide or the mixture of the copper oxides, and the nano-particles can be a mixture particle containing two or more out of cuprous oxide, cupric oxide or the mixture of the copper oxides, and metallic copper. The copper oxide film layer on the surface thereof is subjected to the treatment for reducing in the presence of the above-described organic compound having reducibility to recover metallic copper, but duration of the treatment is prolonged depending on the thickness of the copper oxide film layer on the surface; therefore it is commonly preferred that the thickness of the copper oxide film layer on the surface is set thinner. However, when the average particle diameter of the nano-particles is selected from a range of 1 to 20 nm, the time required for the reducing treatment is not so long as to be significant, even for the whole nano-particle made of copper oxides.

As for a copper nano-particle having a copper oxide coating layer on the surface, it is preferable to provide a molecular coating layer in which an organic compound molecule having a group capable of coordinate-bonding to metallic copper atom by using a lone electron-pair of nitrogen, sulfur and oxygen such as an amino group of an alkyl amine is coordinately bonded onto a site where the copper oxide coating layer is not present, but, in place, metallic copper is present on the surface. The molecular coating layer composed of the organic compound molecule being coordinately bonded shows a function of inhibiting such a phenomenon that a coagulated particle is formed from the copper nano-particles having the copper oxide coated layer by contacting the parts in which the copper oxide coating layer is not present, but in place, metallic copper is present on the surface. On the other hand, as the molecular coating layer composed of organic compound molecules being coordinately bonded is released by heating-up in the step of heat treatment, it does not remain on the surface of the copper nano-particle produced when the reducing treatment will be finished.

In addition, when using a dispersion containing copper oxide nano-particles in place of copper nano-particles having the copper oxide film layer on the surface, the particles is prepared in such a form that the surface is coated with an organic compound used for said formation of the molecular coating layer to provide the copper oxide nano-particles being more superior in dispersion property.

Furthermore, when using said dispersion of the nano-particles for forming wiring, with the purpose of uniform dispersing, increased concentration, adjusting liquid viscosity or improved adhesiveness to a substrate of the dispersion, it is possible to add a resin component which functions as an organic binder, a thixotropic agent for adjusting viscosity or an organic solvent for dilution to the dispersion and further mix/stir it to prepare the dispersion of the nano-particles which will be used for coating and drawing. On the other hand, the copper nano-particles with a copper oxide film layer covering over the surface or copper oxide nano-particles themselves do not cause fusion bonding between the nano-particles even when they contact each other, because of the coating with oxide film being present on the surface, and do not cause such a phenomenon as to hinder uniform dispersion performance, such as the formation of a coagulated particle. Accordingly, the nano-particles can be accumulated in a dense multi-layered state along with the vaporization of the dispersing solvent, in the coated layer being drawn therewith.

After drawing a wiring pattern on a substrate with the use of the dispersion of nano-particles has been finished, the plated circuit is heated up, for instance, in the apparatus for heat treatment (reducing and baking treatment) as shown in FIG. 1, at a heating temperature selected from a range of 300° C. or lower, in the presence of an organic compound having reducibility in order to carry out said reducing treatment and baking treatment, so that the reduction of the oxide film on the surface is performed by using an organic compound having reducibility as a reducing agent. As for the organic compound having reducibility, which can be used as the reducing agent, variety of organic compounds can be employed as long as they are capable of reducing cuprous oxide and cupric oxide into copper and exist as a liquid or a vapor at the above described heating temperature. A preferred example of such an organic compound having reducibility usable in the first aspect of the present invention includes an organic compound having a hydroxyl group transformable to an oxo group ($=$O) or a formyl group (—CHO) by oxidation, or a concomitant use of two or more types of the compounds, if needed. Among them, a further preferred example includes an organic compound having two or more hydroxyl groups. Specifically, a preferred example of an organic compound having reducibility usable in the first aspect of the present invention includes an aliphatic monoalcohol such as methyl alcohol, ethyl-alcohol, isopropyl alcohol, 2-butyl alcohol and 2-hexyl alcohol; an aliphatic polyhydric alcohol such as ethylene glycol (1,2-ethanediol), propylene glycol (1,2-propanediol), 1,3-propanediol, glycerin (1,2,3-propanetriol) and 1,2-butanediol; an aromatic monoalcohol such as benzyl alcohol, 1-phenylethanol, diphenyl carbitol (diphenylmethanol) and benzoin (2-hydroxyl-1,2-diphenylethanone); an aromatic polyhydric alcohol such as hydrobenzoin (1,2-diphenyl-1,2-ethanediol), Further a saccharide such as glucose, maltose and fructose, and a macromolecular alcohol such as a polyvinyl alcohol (PVA) and ethylenevinylalcohol (EVOH). In addition, an epoxy compound transformable to 1,2-diol compounds or an oxetane compound transformable to 1,3-diol by a reaction with a moisture existing in a system during heat treatment can be used, when water causing such a reaction exists or is formed in the system. Furthermore, an aromatic hydroguinone such as hydroguinone can be used as the above described reducing agent. The organic compound having the hydroxyl group show a reducing action of reducing cuprous oxide and cupric oxide, by using the reaction in which the hydroxyl groups (—OH) is oxidized under heating to convert into the oxo group ($=$O) or the formyl group (—CHO).

On the other hand, it is further preferred that a reaction by-product formed from the organic compound having the hydroxyl group, which results from the reaction that the hydroxyl group (—OH) is oxidized under heating to convert into the oxo group ($=$O) or the formyl group (—CHO), is removable by heating for evaporation and gasification.

The organic compounds having reducibility to be present in a system during the heat treatment may be beforehand blended in the dispersion of nano-particles, which will be used for forming the coated layer, or may be present in an atmosphere for the heat treatment as a vapor of the organic compound having reducibility. In that case, it is necessary to blend the organic compound having reducibility into the dispersion in response to the total amount of a copper oxide coating film contained at least in nano-particles having a copper oxide film layer on the surface to be reduced, because the organic compound having reducibility is consumed by the above described reducing treatment. Alternatively, when the organic compound having reducibility is supplied in the form of vapor, it is necessary to select the amount of the vapor to be supplied in response to the total amount of the copper oxide coating film.

When the organic compound having reducibility is blended in the dispersion, the blending ratio is preferably selected from a range of 1 to 50 mol hydroxyl group (—OH) to be oxidized, which is contained in the organic compound having reducibility, per 63.55 g of copper nano-particles having a copper oxide film layer on the surface contained in the dispersion.

In addition, when the organic compound having reducibility is supplied in the form of vapor, the preferable amount of the organic compound having reducibility to be supplied to a system in the form of vapor is in a range of 1 to 50 mol in terms of a hydroxyl group (—OH) to be oxidized, per 63.55 g of copper nano-particles having a copper oxide film layer on the surface contained in the coated layer. Alternatively, the vapor pressure of the organic compound having reducibility to be present in the atmosphere during the heat treatment is preferably selected from a range of 100 to 2,000 hPa.

In addition, an atmosphere for heat treatment is preferably kept to an atmosphere of an inert gas such as nitrogen, in order to avoid a temporarily-reduced surface from being re-oxidized.

Further, the heat treatment temperature should be appropriately selected in consideration of the reactivity of the organic compound having reducibility to be used, and is preferably selected at least from a range of 300° C. or lower and, for instance, 180° C. or higher, and normally 250° C. or higher. In addition, the temperature is set and adjusted so as to be kept in such a temperature range as to satisfy requirement due to heat resisting feature depending on the material for the substrate of the printed circuit itself, which is placed in a treatment apparatus, which is a range of 300° C. or lower, and, for instance, of 180 to 300° C. The duration for reducing treatment and baking treatment can be selected from a range of 1 minute to 1 hour, and preferably 5 minutes to 30 minutes, though depending on said conditions such as set temperature, and concentration, vapor pressure and reactivity of the reducing agent. Specifically, the set temperature and the treatment time are appropriately selected in consideration of the thickness of the copper oxide film layer which covers over the surface of the nano-particle and the time required for the reduction thereof.

Drawing of a wiring pattern can be carried out with the use of a dispersion containing nano-particles, so that the precision performance of the fine drawing therewith is equivalent to that for the conventional formation of a fine wiring pattern with the use of gold and silver nano-particles. Specifically, the formed fine wiring pattern can acquire a satisfactory uniformity of wiring width and reproducibility, in such a case in which the minimum wiring width is selected from a range of 0.5 to 200 μm and practically of 5 to 50 μm, and the minimum space between wires corresponding thereto is selected from a range of 0.5 to 200 μm and practically of 5 to 50 μm. In addition, a resultant wiring layer obtained thereby is a sintered product layer of copper nano-particles having no oxide film lying on interfaces, and shows such adequate electroconductive performance as at least the volume resistivity of $30 \times 10^{-6}$ Ω·cm or lower and of $20 \times 10^{-6}$ Ω·cm or lower in most cases for the minimum wiring width of the above described value. In addition, when the process is applied for forming a copper thin film, the formed copper thin film shows adequate surface flatness and the uniformity of a film thickness with high reproducibility, in such a case where the average film thickness is selected from a range of 0.1 to 20 μm, and practically, from a range of 1 to 10 μm.

In addition, the sintered product layer formed thereby can inhibit reduction in wiring thickness and the breaking of a wire caused by electromigration, even in the case of such a fine wiring pattern as described above, because copper itself is an electroconductive material being low in the risk of electromigration.

Embodiments in the First Aspect According to the Present Invention

The first aspect according to the present invention will be explained more specifically with reference to Examples shown below. Although these examples are the examples of the best mode according to the first aspect of the present invention, the first aspect of the present invention is not limited to these examples.

Examples 1-1 to 1-4 and Comparative Examples 1-1 to 1-3

Reduction/Baking Treatment in Vapor of Organic Compound

A commercially available dispersion of copper ultra fine particles (brand name: independently dispersed ultra fine particle, Perfect copper made by Ulvac Materials, Inc.) was used, which is specifically a dispersion of copper nano-particles having a surface oxide film layer with an average particle diameter of 5 nm, containing 100 parts by mass of copper fine particles partially having an oxide film layer on the surface, 15 parts by mass of dodecylamine (the molecular weight of 185.36 and the boiling point of 248° C.) as an alkyl amine, and 75 parts by mass of mineral spirit as an organic solvent.

To 100 parts by mass of a dispersion of the copper ultra fine particles, 5 parts by mass of toluene was added, and then 100 parts by mass of methanol was added to precipitate the contained copper fine particles. With respect to 80 parts by mass of the copper fine particles, which is collected by removing a supernatant liquid and removing a remaining solvent under a reduced pressure, 16 parts by mass of bis(2-ethylhexyl)amine was added as an amine compound and 4 parts by mass of liquid paraffin as a resin component. The above substances were mixed, stirred and conditioned to form a paste. The viscosity of the paste was adjusted to about 80 Pa·s by adding a thixotropic agent or a dilution solvent (toluene). The paste (a dispersion of copper nano-particles having a surface oxide film layer) of which the viscosity had been already adjusted was coated on a substrate for printed wiring with a screen printing method, to form a dispersion-coated layer into a circuit pattern having the size of line/space=25/25 μm, by using a screen printing plate made of stainless steel with the mesh size of #500. The average layer thickness of the coated layer was 10 μm.

The substrate 1 having the coated layer drawn thereon was placed at a predetermined position on a heater 3 arranged in an enclosed vessel 2. Then, an organic compound was previously gasified and the vapor of the organic compound was mixed with an inert gas such as a nitrogen gas. The substrate 1 was heated at 250° C. for 15 minutes while blowing the mixed gas from a gas inlet 4 into the vessel 2. In the vessel 2, the partial pressure of the vapor of the organic compound supplied together with the inert gas was kept to a range of 50 to 90% of the internal pressure of the vessel 2, and the nano-particles contained in the coated layer which had been drawn on the substrate 1 were heated in the presence of the organic compound vapor.

The organic compound used as a vapor source was glycerin (1,2,3-propane triol with the boiling point of 290.5° C. (decomposition)) in Example 1-1, 1,2-propanediol (boiling point: 187.85° C.) in Example 1-2, isopropyl alcohol (boiling point: 82.4° C.) in Example 1-3, and 2,3-butanediol (a meso body with the boiling point of 181.7° C. (742 mmHg)) in Example 1-4, any of which has an alcoholic hydroxyl group and is an alcohol showing reducibility originating in the hydroxyl group; and on the other hand, was phenol (boiling point: 182° C.) in Comparative Example 1-1, dimethoxyethane (ethyleneglycoldimethylether with a boiling point of 82 to 83° C.) in Comparative Example 1-2, and ethylenediamine (boiling point: 116 to 117° C.) in Comparative Example 1-3. The organic compounds used in Comparative Examples 1-1 to 1-3 did not contain an alcoholic hydroxyl group, and did not show reducibility at the heating temperature.

After the substrate had been heated in the above described condition, a sintered product layer of reduced copper nano-particles was formed on a circuit pattern of the substrate which had been treated in conditions of Examples 1-1 to 1-4. The obtained copper wiring of a sintered product layer had the wiring width and the space between wires of each 25 μm, and the average layer thickness of 5 μm. When volume resistivity (25° C.) was calculated on the basis of the measured resisatance of the copper wiring layer, and on the assumption that the wire is a homogeneous substance having the above described wiring width and the average layer thickness, any value was $20 \times 10^{-6}$ Ω·cm or lower as shown in Table 1-1. When the value is compared with the resistivity (at 20° C.) of copper itself which is $1.673 \times 10^{-6}$ Ω·cm, it is assumed that the copper nano-particles are densely sintered with each other in an obtained copper-sintered product wiring layer. In addition, as a result of observation with a SEM, no inclusion of copper oxides was recognized in grain boundaries between the copper nano-particles, which implied that such a sintered product as to show adequate electroconductivity is formed.

On the other hand, in Comparative Examples 1-1 to 1-3 treated in the condition, a sintered product layer was formed, but the resistance of the sintered product layer exceeded a measurable resistance range though the measurement was tried. From the result, it is assumed that the volume resistivity (at 25° C.) greatly exceeded at least $100 \times 10^{-6}$ Ω·cm.

TABLE 1-1

(These samples were heat-treated in the vapor of an organic compound.)

|  | Organic compound for vapor source | Boiling point | Volume resistivity (μΩ · cm) |
|---|---|---|---|
| Example 1-1 | glycerin | 290.5° C. (decomposition) | 6.6 |
| Example 1-2 | 1,2-propanediol | 187.85° C. | 8.1 |
| Example 1-3 | isopropyl alcohol | 82.4° C. | 18.3 |
| Example 1-4 | 2,3-butanediol | 181.7° C. (742 mmHg) | 7.5 |
| Comparative Example 1-1 | phenol | 182° C. | >100 |
| Comparative Example 1-2 | dimethoxyethane | 82-83° C. | >100 |
| Comparative Example 1-3 | ethylenediamine | 116-117° C. | >100 |

Examples 1-5 to 1-11 and Comparative Example 1-4

Reduction/Baking in Presence of Organic Compound Contained in Coated Layer

At first, an aqueous dispersion containing copper ultra fine particles was prepared by a wet reductive reaction. After 30 g of copper sulfate was dissolving in 100 ml of distilled water, 100 g of diethanolamine was added as a reducing agent into the aqueous solution which was heated to 80° C. Subsequently, a wet reductive reaction was proceeded for eight hours while stirring was continued, and a dark brown aqueous dispersion containing formed copper fine particles was obtained. Acetone was added into the dispersion to remove diethanolamine and precipitate copper fine particles. The cleaning operation with the use of acetone was repeated three times to remove a remaining raw material, a by-product due to a reaction and impurities. The obtained copper fine particles had a surface oxide film layer partially on the surface, which is oxidized copper, and had the average particle diameter of 9 nm.

With respect to 90 parts by mass of the obtained copper fine particles, 10 parts by mass of bis(2-ethylhexyl)amine was added as an amine compound. After they were mixed, 200 parts by mass of the following organic compounds were added to the mixture and the resultant mixture was stirred. The above substances were mixed and conditioned to form a paste. The viscosity of the paste was adjusted to about 80 Pa·s by adding a thixotropic agent or a dilution solvent (toluene). The paste (a dispersion of copper nano-particles having a surface oxide film layer) of which the viscosity had been already adjusted was coated on a substrate for printed wiring with a screen printing method, to form a dispersion-coated layer into a circuit pattern having the size of line/space=25/25 μm, by using a screen printing plate made of stainless steel with the mesh size of #500. The average layer thickness of the coated layer was 10 μm.

The substrate 1 having the coated layer drawn thereon was placed at a predetermined position on a heater 3 arranged in an enclosed vessel 2. The substrate 1 was heated at 250° C. for 15 minutes in the vessel 2 having an atmosphere of nitrogen gas which had been blown into the vessel 2 from a gas inlet 5. During the heat treatment, the nano-particles contained in the coated layer which had been drawn on the substrate 1 were heat-treated in the presence of an organic compound blended in the paste.

As an organic compound to be blended with the paste of which the viscosity had been already adjusted, glycerin (1,2, 3-propane triol, boiling point: 290.5° C. (decomposition)) was used in Example 1-5, erythritol (meso form, melting point: 121° C.) in Example 1-6, 1,2-cyclohexanediol (cis-form, boiling point: 116° C. (13 mmHg)) in Example 1-7, hydrobenzoin (meso form, melting point: 138° C.) in Example 1-8, glucose (D-form, melting point of anhydrous a form: 146° C.) in Example 1-9, polyvinyl alcohol (—CH$_2$CH (OH)—, second order transition point: 65 to 85° C.) in Example 1-10, and hydroguinone (boiling point: 285° C. (730 mmHg)) in Example 1-11. On the other hand, resorcinol (1,3-benzendiol: boiling point: 281.4° C.) was used in Comparative Example 1-4. The organic compound used in Examples 1-5 to 1-11 has a hydroxyl group, and is a compound which would show reducibility when the hydroxyl group (—OH) would be oxidized into an oxo group (═O) or a formyl group (—CHO).

After the substrate had been heated in the above described condition, a sintered product layer of reduced copper nano-particles was formed on a circuit pattern of the substrate which had been treated in conditions of Examples 1-1 to 1-4 making the organic compounds present. The obtained copper wiring of a sintered product layer had the wiring width and the space between wires of each 25 μm, and the average layer thickness of 5 μm. When volume resistivity (25° C.) was calculated on the basis of the measured resistance of the copper wiring layer, and on the assumption that the wire is a homogeneous substance having the above described wiring width and the average layer thickness, any value was $30 \times 10^{-6}$ Ω·cm at highest as shown in Table 1-2. When the value is compared with the resistivity (at 20° C.) of copper itself which is $1.673 \times 10^{-6}$ Ω·cm, it is assumed that the copper nano-particles are densely sintered with each other in an obtained copper-sintered product wiring layer. In addition, as a result of observation with a SEM, no inclusion of copper oxides was recognized in grain boundaries between the copper nano-particles, which implied that such a sintered product as to show adequate electroconductivity is formed.

On the other hand, in Comparative Example 1-4 treated in the condition of making the organic compound exist, a sintered product layer was formed, but the resistance of the sintered product layer exceeded a measurable resistance range though the measurement was tried. From the result, it is assumed that the volume resistivity (at 25° C.) greatly exceeded at least $100 \times 10^{-6}$ Ω·cm.

TABLE 1-2

(These samples were heat-treated in the presence of an organic compound added to and mixed in the dispersion.)

|  | Organic compound added into dispersion | Molecular weight | Volume resistivity (µΩ · cm) |
|---|---|---|---|
| Example 1-5 | glycerin | 92.10 | 26.7 |
| Example 1-6 | erythritol | 122.12 | 9.8 |
| Example 1-7 | 1,2-cyclohexanediol | 116.16 | 19.0 |
| Example 1-8 | hydrobenzoin | 214.26 | 19.3 |
| Example 1-9 | glucose | 180.16 | 14.3 |
| Example 1-10 | polyvinyl alcohol |  | 10.4 |
| Example 1-11 | hydroguinone | 110.11 | 16.8 |
| Comparative Example 1-4 | resorcinol | 110.11 | >100 |

Example 1-12

Reduction/Baking Treatment in Vapor of Organic Compound

A commercially available dispersion of copper ultra fine particles (brand name: independently dispersed ultra fine particle Perfectcopper, made by Ulvac Materials, Inc.) was used, which is a dispersion of copper nano-particles having partially an oxide film layer with an average particle diameter of 5 nm on the surface, specifically containing 100 parts by mass of copper fine particles, 15 parts by mass of dodecylamine (the molecular weight of 185.36 and the boiling point of 248° C.) for an alkyl amine, and 75 parts by mass of mineral spirit as an organic solvent.

To 100 parts by mass of a dispersion of the copper ultra fine particles, 5 parts by mass of toluene was added, and then 100 parts by mass of methanol was added to precipitate the contained copper fine particles. With respect to 80 parts by mass of the copper fine particles, which was collected by removing a supernatant liquid, and removing a remaining solvent under a reduced pressure, 16 parts by mass of bis(2-ethylhexyl) amine was added as an amine compound and 4 parts by mass of liquid paraffin as a resin component. The above substances were mixed, stirred and conditioned to form a paste. The viscosity of the paste was adjusted to about 80 Pa·s by adding a thixotropic agent or a dilution solvent (toluene). The paste (a dispersion of copper nano-particles having a surface oxide film layer) of which the viscosity had been already adjusted was coated on a substrate for printed wiring with a screen printing method, to form a dispersion-coated layer into a circuit pattern having the size of line/space=25/25 µm, by using a screen printing plate made of stainless steel with the mesh size of #500. The average layer thickness of the coated layer was 10 µm.

The substrate 1 having the coated layer drawn thereon was placed at a predetermined position on a heater 3 arranged in an enclosed vessel 2. Then, glycerin was put in a saucer vessel for vaporizing an organic compound, which was placed on a heater 3, and the substrate was heated at 250° C. for 15 minutes while nitrogen gas was blown into the enclosed vessel through a gas inlet 4. During the heat treatment, the nano-particles contained in the coated layer which had been drawn on the substrate 1 were heat-treated in the presence of the glycerin vapor which was gasified and vaporized from glycerin put into the saucer vessel for vaporization.

After the substrate had been heated in the above described condition, a sintered product layer of reduced copper nano-particles was formed in a circuit pattern of the substrate. The obtained copper wiring of a sintered product layer had the wiring width and the space between wires of each 25 µm, and the average layer thickness of 5 µm. When volume resistivity (25° C.) was calculated on the basis of the measured resistance of the copper wiring layer, and on the assumption that the wire is a homogeneous substance having the above described wiring width and the average layer thickness, the value was $6.2 \times 10^{-6}$ Ω·cm. When the value is compared with the resistivity (at 20° C.) of copper itself which is $1.673 \times 10^{-6}$ Ω·cm, it is assumed that the copper nano-particles are densely sintered with each other in an obtained copper-sintered product wiring layer. In addition, as a result of observation with a SEM, no inclusion of copper oxides was recognized in grain boundaries between the copper nano-particles, which implied that such a sintered product as to show adequate electroconductivity is formed.

The Second Aspect of the Present Invention

In a process for forming a fine-shaped conductor of sintered product type of copper fine particles according to the second aspect of the present invention, considering that copper nano-particles are extremely apt to be oxidized in contrast to metallic nano-particles of gold and silver which are noble metals, and that there is no means for completely preventing the oxidation, in the case where copper nano-particles, for instance, with an average particle diameter of 100 nm or smaller is selected as the copper fine particles used when the process is applied for forming a fine copper-based wiring pattern made of a sintered product layer of copper fine particles sintered with each other on a substrate, considering that when selecting copper nano-particles, for instance, with an average particle diameter of 100 nm or smaller as the copper fine particles used for forming a fine copper-based wiring pattern made of a sintered product layer of copper fine particles combined with each other on a substrate, the copper nano-particles are extremely prone to be oxidized in contrast to the metallic nano-particles of gold and silver, which are noble metals, and also that there is no means for completely preventing the oxidation, a copper-based wiring pattern that is inexpensive and low in the risk of electromigration is formed through such a process that a dispersion of nano-particles having a copper oxide coating layer on the surface or copper oxide nano-particles is prepared, and a desired wiring pattern on the substrate is drawn with the use of said dispersion of the nano-particles, and then the copper oxide coating layer that is present on the surface of the nano-particle is reduced to recover the copper nano-particles therefrom, and treatment for baking them is conducted to form a layer of dense sintered product made of the copper nano-particles sintered with each other in the coating layer.

Particularly, in the process for forming the fine-shaped conductor of sintered product type of copper fine particles according to the second aspect of the present invention, in the first treatment step of reducing a copper oxide film layer being present on the surfaces of nano-particles or the copper oxide nano-particles, heat-treatment therefor is conducted under an atmosphere including a vapor or a gas of the organic compound having reducibility at a heating temperature selected from 350° C. or lower, whereby the organic compound having reducibility supplied from vapor phase acts, as a reducing agent, on the surface of the fine particles that contained in the coating layer, and thereby reduction reaction for the copper oxide on the surface can progress quickly even at as low a heating temperature as 350° C. or lower. Through a solid phase reaction between the copper atom of in a non-oxidized state that is once produced on the surface and the copper oxide molecule being present inside, the copper oxide being present inside is converted to a copper atom in the non-oxidized state, and in place, an copper oxide is formed on the surface. After that, the copper oxide formed on the surface is reduced again to a copper atom in the non-oxidized state by the reducing action of the organic compound having reducibility which is continuously supplied. As a result of the repetition of a series of the above described reaction cycle, the copper oxide film layer which has initially reached a deep part of the fine particle is gradually reduced, and finally, the whole fine particle is turned into a copper fine particle.

If the recovered copper fine particle is contacted again with an oxygen molecule in the atmosphere or the like over a fixed duration under heating-up condition, a surface oxide film arises thereon again, but in the case of the process according to the second aspect of the present invention, the fine particles is subjected to the oxidation treatment in which it is contacted again with a mixture of gas containing oxygen molecules such as air under heating-up condition for a short time. Subsequently, an organic compound having reducibility supplied from vapor phase acts thereon as a reducing agent under heating-up condition, and thereby an oxide layer in the shape of a monomolecular layer formed on the surface by the oxidation treatment is re-reduced, whereby the surface of the copper fine particle recovered comes to a cleaner surface on which copper atoms are exposed. Thus, even in the case of copper fine particles, for instance, with an average particle diameter of several micrometers, such a circumstance that copper atoms being capable of surface-migration exists thereon in the level similar to that of the surface of copper nano-particle, when the surfaces are brought into close contact with each other. As a result, sintering is quickly advanced at such a comparatively low temperature to form a dense sintered product layer made of the copper fine particles from the whole coating layer. At that time, the cleaner surface on which copper atoms that are produced by one time of treatment are exposed is formed only on a part of the surface of the copper fine particles with an average particle diameter of several micrometers, so that it is more effective on forming the densely sintered product layer of the copper fine particles that the oxidizing treatment and re-reducing treatment are repeated to bring about progressive expansion of the sintered portion of the copper fine particles sintered with each other.

Besides, the portion where copper atoms being capable of surface migration are present in the level similar to that of the surface of the copper nano-particles is such a portion where the local curvature of its surface is as small as 100 nm, and therefore, in the case of copper fine particles with an average particle diameter of greatly exceeding several micrometers, there is extremely low probability for such a local structure to exist in a part contacting with adjacent particles, so that it is far from attaining the formation of the dense sintered product layer, as a whole. On the other hand, in the case of the copper nano-particles with an average particle diameter of 100 nm or smaller, the step above described progresses much more remarkably in comparison with the copper fine particles with the average particle diameter of several micrometers, so that a much denser sintered product layer can be formed therefrom. In addition, in the case of the copper nano-particles with the average particle diameter of 100 nm or smaller, progressive expansion of the portion of the copper fine particles sintered with each other can be achieved by repeating the oxidizing treatment and the re-reducing treatment even at a lower heating temperature.

In a process according to the second aspect of the present invention, first of all, with the use of the dispersion containing copper fine particles having a surface oxide film layer or the copper oxide fine particles, a coated layer of the dispersion is drawn in line with pattern of the aimed plane shape of fine-shaped conductor. In such a case, the average particle diameter of the copper fine particles having the surface oxide film layer or the copper oxide fine particles used as a dispersoid is appropriately selected in response to a minimum wiring width in the plane shape of pattern to be formed and the film thickness of the sintered product layer to be produced, but the average particle diameter shall be chosen at least from a range of 10 μm or smaller. Specifically, taking account of precision for control required to the line width or film thickness of the sintered product layer to be formed, the average particle diameter of the copper fine particles used for forming the sintered product layer needs to be selected from such a range as to achieve the precision required, and is preferably selected at least within ¼, and more preferably within ½₀ of said minimum film thickness of the sintered product layer to be formed, and within ¹⁄₁₀, and more preferably within ¹⁄₂₀ of said minimum wiring width thereof.

For instance, the process for forming the fine copper-based wiring pattern according to the second aspect of the present invention, utilizes a copper-based wiring made of the sintered product, at first, for the purpose of avoiding the breaking of a wire caused from the electromigration phenomenon, which is most remarkably found in a part having the minimum wiring width in the case of formation of extremely fine wiring pattern, and in particular, it is more preferable process for such a case in which the minimum wiring width of the wiring pattern is chosen within a range of 0.5 to 200 μm, and practically within a range of 5 to 50 μm, and correspondingly the minimum space between wires is chosen within a range of 0.5 to 200 μm, and practically, within a range of 5 to 50 μm. In consideration of said minimum wiring width, nano-particles with an average particle diameter of 100 nm at most are preferably used as the copper fine particles used for forming the sintered product layer adaptable to the precision. On the other hand, as the film thickness of the sintered product layer is selected from a range of sub-micrometers to several micrometers, in correspondence with said minimum wiring width of several micrometers, from a viewpoint of adequately satisfying surface smoothness for the film thickness, the average particle diameter of nano-particles having a copper oxide film layer on the surface to be used is selected from a range of 1 to 100 nm, and preferably from a range of of 1 to 20 nm. At least, in the case of the process for forming a fine wiring pattern according to the second aspect of the present invention, when drawing the above described extremely fine wiring pattern with high uniformity for wiring width by using a dispersion of nano-particles, it is desired that the average particle diameter of nano-particles to be used is selected from a range of ¹⁄₁₀ or less values of the aimed minimum wiring width and the minimum space between wires. Simultaneously, the thickness of a wiring layer of a copper-sintered product is appropriately determined in response to the minimum wiring width, and normally, in such a shape that the layer thickness of the wiring layer is significantly small in comparison with the minimum wiring width, and in such a case, variations in the layer thickness of the wiring layer and the non-uniformity of a local height can be suppressed by selecting the average particle diameter of the nano-particles from a range of 1 to 100 nm, and preferably from a range of 1 to 20 nm.

In the case of the process for forming the copper thin film according to the second aspect of the present invention, when forming an extremely thin copper film with an average film thickness of sub-micrometers to several micrometers, a high uniformity and controllability of the film thickness can be achieved by selecting an average particle diameter of nano-particles having a copper oxide film layer on the surface to be used from a range of 1 to 100 nm, and preferably of 1 to 20 nm. On the other hand, the process for forming a fine-shaped conductor of sintered product type of copper fine particles according to the second aspect of the present invention can be applied to the formation of a copper thin film with an average film thickness of about several micrometers to several tens of micrometers for instance, and in such a case, an average particle diameter of the copper fine particles having a copper oxide film layer on the surface to be used can be selected from a range of sub-micrometers to several micrometers. In addition, such a mode in which the copper fine particles having a copper oxide film layer on the surface with an average particle diameter of sub-micrometers to several micrometers is used in combination with the copper nano-particles having a copper oxide film layer on the surface with an average particle diameter of 100 nm or smaller may be employed.

Further, as for the copper fine particle having the copper oxide film layer, contained in the dispersion containing the copper fine particles having the surface oxide film layer or the copper oxide fine particles, at least the copper oxide film layer is comprising of cuprous oxide, cupric oxide or the mixture of the copper oxides, and the fine particles can be a mixture particle containing two or more out of cuprous oxide, cupric oxide or the mixture of the copper oxides, and metallic copper. Particularly, when, as the copper fine particles having the surface oxide film layer to be contained in the dispersion, the copper nano-particles having a copper oxide film layer on the surface with an average particle diameter of 100 nm or smaller are contained therein, such a phenomenon that the metallic surfaces of the nano-particles come into direct contact with each other in the dispersion, which gives rise to formation of coagulated particle by mutual fusion can be avoided with use of such a form in which the surfaces of the copper nano-particles is uniformly coated with the copper oxide film layer is chosen.

In the process for forming a fine-shaped conductor of sintered product type of copper fine particles according to the second aspect of the present invention, an electrical contact between the copper fine particles is achieved by formation of the sintered product, so that the dispersion to be used shall have a composition containing no resin component acting as a binder. Accordingly, variety of dispersive solvents may be employed as a dispersive medium contained in the dispersion, as long as the dispersive solvent is used suitably for applying the dispersion to form a coating film layer in the shape of aimed fine pattern. However, it is necessary that used is a dispersive solvent being removable by vaporizing at the heat treatment temperature, because when performing the heat treatment described below, a vapor of a compound having reducibility supplied from vapor phase needs to reach the inside of the coated layer in other to act thereon. Accordingly, the dispersive solvent to be used needs to be liquid at room temperature, have at least a melting point of 20° C. or lower and preferably of 10° C. or lower. On the other hand, it needs to show a high degree of vaporizability at a heat treatment temperature selected from a range of 350° C. or lower, so that its boiling point is at least 350° C. or lower and preferably 300° C. or lower. However, if its boiling point is lower than 100° C., the vaporization of the dispersive solvent considerably progresses in the step of drawing the coated layer, which may become a factor of causing variations in an amount of the copper fine particles having a surface oxide film layer contained in the coated layer. Accordingly, the dispersive solvent is more preferably selected from those having a boiling point at least in a range of 100° C. or higher and 300° C. or lower.

As for the dispersive solvent usable for preparing a dispersion containing copper fine particles having a surface oxide film layer or copper oxide fine particles, for instance, a hydrocarbon solvent having a high boiling point, such as tetradecane can be employed. In addition, organic solvents showing reducibility when heated, including a polyvalent alcohol with a boiling point of 300° C. or lower, such as ethylene glycol and 2-ethylhexane-1,3-diol, can be chosen as a dispersive solvent itself. If the organic solvent showing reducibility when heated is used as a dispersive solvent, the dispersive solvent itself will act as a reducing agent in the step of reducing treatment as explained later, and thus the contribution thereof can be partially utilized therein. Even in such a case, at least in the beginning of an oxidizing treatment step in the second treatment step after having finished the first treatment step, the dispersive solvent used must not remain in the coated layer so as to prepare a state in which oxygen molecules can enter into the inside of the coated layer from vapor phase.

In some cases, when using said dispersion of the fine particles for forming wiring, with the purpose of uniform dispersing, increased concentration, adjusting liquid viscosity or improved adhesiveness to a substrate of the dispersion, it is possible to add a resin component which functions as an organic binder, a thixotropic agent for adjusting viscosity or an organic solvent for dilution to the dispersion and further mix/stir it to prepare the dispersion of the fine particles which will be used for coating and drawing. On the other hand, the copper fine particles with a copper oxide film layer covering over the surface or copper oxide fine particles themselves do not cause fusion bonding between the fine particles even when they contact each other, because of the coating with oxide film being present on the surface, and do not cause such a phenomenon as to hinder uniform dispersion performance, such as the formation of a coagulated particle. Accordingly, the copper fine particles having the copper oxide film layer are deposited/exsiccated along with the vaporization of the dispersing solvent in the coated layer being drawn therewith, and finally can be accumulated in a dense multi-layered state.

In addition, as for a technique for drawing a desired wiring pattern on a substrate with the use of the dispersion containing the copper fine particles having a surface oxide film layer or copper oxide fine particles, any drawing technique of screen printing, ink jet printing and decalcomania printing, which are conventionally used for forming a fine wiring pattern by using the dispersion containing metallic nano-particles, can be applicable as well. Specifically, it is desired that a more suitable technique is selected from the screen printing, the ink jet printing or the decalcomania printing, in consideration of the shape of the fine wiring pattern, the minimum wiring width and the layer thickness of the wiring layer to be targeted.

On the other hand, it is desired that the dispersion containing the fine particles to be used is prepared so as to obtain each suitable liquid viscosity in response to an adopted drawing technique. For instance, when the screen printing is used for drawing the fine wiring pattern, it is desired that the liquid viscosity is selected from a range of 30 to 300 Pa·s (25° C.) for the dispersion containing the fine particles. In addition, when the decalcomania printing is used, it is desired that the liquid viscosity therefor is selected from a range of 3 to 300 Pa·s (25° C.). When the ink jet printing is used, it is desired that the liquid viscosity therefor is selected from a range of 1 to 100 mPa·s (25° C.). The liquid viscosity of the dispersion containing the fine particles is varied depending on an average particle diameter and dispersion concentration of fine particles to be used, and a type of a used dispersing solvent, and thus the liquid viscosity can be adjusted to an aimed value by appropriately selecting the above-described three factors.

After drawing a wiring pattern on a substrate with the use of the dispersion of copper fine particles having the surface oxide film layer or copper oxide fine particles has been finished, at first, the plated circuit is heated up in the apparatus for heat treatment (reducing and baking treatment) at a heating temperature selected from a range of 350° C. or lower, under an atmosphere containing a vapor or a gas foam compound having reducibility, in order to carry out said reducing treatment for the first treatment step, so that the reduction of the oxide film on the surface is performed by using reductive organic compound supplied from vapor phase as a reducing agent. As for the reductive organic compound, which can be used as the reducing agent, variety of organic compounds can be employed as long as they are capable of reducing cuprous oxide and cupric oxide into copper and exist as a vapor at the above described heating temperature. A preferred example of such reductive organic compound usable in the second aspect of the present invention includes an organic compound having a hydroxyl group transformable to an oxo group (=O) or a formyl group (—CHO) by oxidation, or a concomitant use of two or more types of the compounds, if needed. Among them, a further preferred example includes an organic compound having two or more hydroxyl groups. Specifically, a preferred example of reductive organic compound usable in the second aspect of the present invention includes an aliphatic monoalcohol such as methyl alcohol, ethyl-alcohol, isopropyl alcohol, 2-butyl alcohol and 2-hexyl alcohol; an aliphatic polyhydric alcohol such as ethylene glycol (1,2-ethanediol), propylene glycol (1,2-propanediol), 1,3-propanediol, glycerin (1,2,3-propanetriol) and 1,2-butanediol; an aromatic monoalcohol such as benzyl alcohol, 1-phenylethanol, diphenyl carbitol (diphenylmethanol) and benzoin (2-hydroxyl-1,2-diphenylethanone); an aromatic polyhydric alcohol such as hydrobenzoin (1,2-diphenyl-1,2-ethanediol). In addition, an epoxy compound transformable to 1,2-diol compounds or an oxetane compound transformable to 1,3-diol by a reaction with moisture existing in a system during heat treatment can be used, when water causing such a reaction exists or is formed in the system. The organic compound having the hydroxyl group show a reducing action of reducing cuprous oxide and cupric oxide, by using the reaction in which the hydroxyl groups (—OH) is oxidized under heating to convert into the oxo group (=O) or the formyl group (—CHO).

On the other hand, it is further preferred that a reaction by-product formed from the organic compound having the hydroxyl group, which results from the reaction that the hydroxyl group (—OH) is oxidized under heating to convert into the oxo group (=O) or the formyl group (—CHO), is removable by heating for evaporation and gasification.

In order to exhibit a sufficiently high reducibility at a heating temperature selected from a range of 350° C. or lower, and 300° C. for instance, such an organic compound of which a boiling point is at least 300° C. or lower so as to easily supply in the form of vapor being beforehand gasified is more suitably used, and thus an example of satisfying the above described preferred matters includes, for instance, ethylene glycol (1,2-ethanediol), propylene glycol (1,2-propanediol), 1,3-propanediol and glycerin (1,2,3-propane triol).

Furthermore, in addition to organic compounds having reducibility, various inorganic gas molecules showing a reducing activity to cuprous oxides and cupric oxides under heating-up condition, for instance, hydrogen molecules can be used.

Further, in a re-reducing treatment step of the second treatment step as well, the same conditions for reducing treatment as in the above described first treatment step are selected, which are an atmosphere containing a vapor and a gas of a compound having reducibility and a heating temperature. Accordingly, the preferred ranges thereof are the same.

Hence, when the organic compound having reducibility is supplied in the form of vapor, the preferable amount of the organic compound having reducibility to be supplied to a system in the form of vapor is in a range of 1 to 50 mol in terms of a hydroxyl group (—OH) to be oxidized, per 63.55 g of copper nano-particles having a copper oxide film layer on the surface contained in the coated layer. Alternatively, the vapor pressure of the organic compound having reducibility to be present in the atmosphere during the heat treatment is preferably selected from a range of 100 to 2,000 hPa.

In addition, when a vapor of an organic compound having reducibility or a hydrogen molecule is supplied into the atmosphere for the heat treatment so as to keep its partial pressure in fixed level, an inert gas such as nitrogen gas is preferably used as a dilution gas or a carrier gas.

In general, such a mode is preferably used, in which an organic compound having reducibility is preferably heated up to vaporize in advance, then a generated vapor is mixed with a carrier gas as needed, and the mixed gas is supplied into a system at a fixed flow rate. Alternatively, such a mode in which the liquid of the organic compound having reducibility is atomized to obtain fine droplets thereof, and the atomized fine droplets are fed into the system at a fixed flow rate with a carrier gas may be employed to use a vapor of the organic compound produced from the fine droplets by vaporization in a heating region.

In the first treatment step, a copper fine particle having a surface oxide film layer or a copper oxide fine particle is reduced to a copper fine particle. The duration required for reducing it under heating-up condition can be appropriately selected in consideration of a heating temperature, a type of a compound having reducibility used as a reducing agent and a mixture ratio thereof in an atmosphere, but normally it is preferable to set a reduction condition for sufficiently completing a reduction reaction in a range between 1 and 15 minutes.

Subsequently, in an oxidation treatment stage of the second treatment step, the surface of a copper fine particle is exposed to an atmosphere containing oxygen for a short time with heating to conduct treatment of slight oxidization thereof. Further, oxidization can be carried out in such a manner wherein a mixed gas containing oxygen is sprayed onto the surface so that prompt switching to re-reducing treatment can be initiated by blowing off after the oxidizing treatment step. In such a case in which the one part of the organic compound having reducibility which is used as a reducing agent in reducing treatment and re-reducing treatment adsorbs to and remains on the surface of the copper fine particle, the exposure into an atmosphere containing oxygen for a short time can give rise to oxidation treatment for the adsorbing molecules, whereby the reaction product produced therefrom can quickly detached and removed away. The remains in the form of Cu—OH, which is partially present on the surface of the copper fine particle, are oxidized into copper oxides, and thus the resultant mono-layer of oxidized film can be removed by reduction in the subsequent stage for subjecting it to the re-reducing treatment.

However, it is unfavorable that the surface of a copper fine particle is excessively oxidized so as to exceed the monolayer of the oxide film, and it is preferable that the time for the stage of the oxidation treatment is controlled to the irreducible minimum range. Specifically, it is preferred that an oxygen content in an atmosphere containing oxygen is selected depending on the heating temperature to control a rate of the oxidation progressing within the time course of such a short duration. For instance, when the heating temperature is set to 300° C. and the atmosphere containing oxygen is the air, the duration for conducting the stage of oxidation treatment is chosen from a range of 30 seconds or shorter, and preferably of 15 seconds or shorter. When the stage is carried out in the manner in which a mixed gas containing oxygen is sprayed onto the surface, normally such a mixture of molecular oxygen blending with an inert gas such as nitrogen gas at a fixed volume ratio can be employed as a mixed gas containing oxygen used therein.

When a dilution gas or a carrier gas used for feeding a vapor of an organic compound having reducibility or hydrogen molecules is, for instance, nitrogen gas, dry air containing about 20 vol. % oxygen from that is dried up by removing contaminant moisture off can be used, or the mixed gas of the fixed vol. % of oxygen blended in nitrogen gas of the rest can be also used.

On the other hand, in the second treatment step, the time duration required for carrying out re-reduction treatment rightly after the stage of oxidation treatment can be appropriately selected in consideration of a heating temperature, a type of a compound having reducibility used as a reducing agent and a mixture ratio in an atmosphere, but normally it is preferable to set a reduction condition for sufficiently attaining adequate step-by-step progress of re-reduction and sintering, within a range between 30 seconds and 300 seconds.

A heat treatment temperature in the steps of the reducing treatment and the baking treatment should be appropriately selected in consideration of the reactivity of an organic compound having reducibility or hydrogen to be used as a reducing agent for the reducing treatment or the re-reducing treatment, and is preferably selected at least from a range of 350° C. or lower and, for instance, from a range of 200° C. or higher, and normally from a range of 250° C. or higher. In addition, the temperature is set and controlled so as to be kept in such a temperature range as to satisfy heat resisting performance depending on the material of substrate of the printed circuit, which is placed in a treatment apparatus, typically within a range of 300° C. or lower and, for instance, within the range of 250 to 300° C. The total time duration for the reducing treatment and the baking treatment can be selected from a range of 10 minutes to 1 hour, though depending on conditions including the set temperature, and the concentration, vapor pressure and reactivity of the reducing agent as explained above. Specifically, the set temperature and the treatment time are appropriately selected in consideration of the thickness of the copper oxide film layer which covers the surface of a copper fine particle and the duration required for the reduction.

In particular, in the first treatment step, the copper oxide film layer covering the surface of a copper fine particle is removed by reduction to recover a copper fine particle therefrom, and then in the second treatment step, an operation consisting of an oxidizing treatment for a short time and a subsequent re-reducing treatment is repeatedly conducted to progress treatment for sintering the copper fine particles with each other, step by step. Accordingly, when the duration for each step of progressing the re-reducing treatment and the treatment of sintering the copper fine particles with each other is chosen to several minutes at longest, and the repetition time is set to about five times, it is preferable to select reducing treatment conditions such as a set temperature, concentration of a reducing agent, vapor pressure and reactivity so that a total duration of the first and second treatment steps can be set in the above described range.

Drawing of a wiring pattern can be carried out with the use of a dispersion containing fine particles having a copper oxide film layer on the surface or copper oxide fine particles, so that the precision performance of the fine drawing therewith is equivalent to that for the conventional formation of a fine wiring pattern with the use of gold and silver fine particles. Specifically, the formed fine wiring pattern can acquire a satisfactory uniformity of wiring width and reproducibility, in such a case in which the minimum wiring width is selected from a range of 0.5 to 200 μm and practically of 5 to 50 μm, and the minimum space between wires corresponding thereto is selected from a range of 0.5 to 200 μm and practically of 5 to 50 μm. In addition, a resultant wiring layer obtained thereby is a sintered product layer of copper fine particles having no oxide film lying on interfaces, and shows such adequate electroconductive performance as at least the volume resistivity of $30 \times 10^{-6}$ Ω·cm or lower and of $10 \times 10^{-6}$ Ω·cm or lower in most cases for the minimum wiring width of the above described value. In addition, when the process is applied for forming a copper thin film, the formed copper thin film shows adequate surface flatness and the uniformity of a film thickness with high reproducibility, in such a case where the average film thickness is selected from a range of 0.1 to 20 μm, and practically, from a range of 1 to 20 μm.

In addition, the sintered product layer formed thereby can inhibit reduction in wiring thickness and the breaking of a wire caused by electromigration, even in the case of such a fine wiring pattern as described above, because copper itself is an electroconductive material being low in the risk of electromigration.

Embodiments in the Second Aspect According to the Present Invention

The second aspect according to the present invention will be explained more specifically with reference to Examples shown below. Although these examples are the examples of the best mode according to the second aspect of the present invention, the first aspect of the present invention is not limited to these examples.

Example 2-1

A pasty dispersion was prepared by adding 20 g of 2-ethylhexane-1,3-diol (melting point: −40° C. and boiling point: 245° C.) as a dispersing solvent, to 80 g of an atomized copper powder 1100Y (with an average particle diameter of 0.9 μm) made by Mitsui Mining & Smelting, and stirring it till it becomes uniform. The copper fine particles had the surface coated with a surface oxide film, and the obtained pasty dispersion had the viscosity (25° C.) of 1 Pa·s. In addition, a volume ratio of the copper fine particles in the above pasty dispersion was 45 vol. %.

A sintered product layer of copper fine particles was formed with the use of the prepared pasty dispersion in the conditions which will be described later, the volume resistivity of the obtained sintered product layer of the copper fine particles was measured, and a state of the copper fine particles cohering with each other in the sintered product layer of the copper fine particles was evaluated.

[Conditions for Preparing Sintered Product Layer of Copper Fine Particles]

Slide glass was used as a substrate, and a pasty dispersion was applied onto the surface to form a strip-shaped coated layer with a width of 1 cm, a length of 5 cm and an average thickness of 10 µm. The first treatment was performed by the steps of: placing the slide glass having the above described coated layer formed thereon, on a hot plate which had been previously heated to 300° C., in a nitrogen atmosphere; keeping it in an atmosphere containing a glycerin vapor having reducibility for five minutes while spraying a mixed gas of glycerin vapor/nitrogen gas onto the surface of the coated layer to reduce a surface oxide film layer.

Subsequently, the second treatment was performed by repeating oxidizing/re-reducing treatment cycles five times in total, which consists of the oxidizing treatment of oxidizing copper fine particles while heating the atmosphere to 300° C. and spraying dry air onto the surface for 10 seconds; and the re-reducing treatment of re-reducing the oxidized copper fine particles while spraying the mixed gas of glycerin vapor/nitrogen gas as a substitute for dry air onto the surface, and keeping it in an atmosphere containing glycerin vapor having reducibility two minutes and 50 seconds. After the substrate had been subjected to the continuous first and second treatment, it was cooled to room temperature in the place while the mixed gas of glycerin vapor/nitrogen gas was sprayed onto the surface.

The mixed gas of glycerin vapor/nitrogen gas used in the present example contained 20 vol. % glycerin vapor, and was transported to and supplied into the treatment apparatus after having had mixing the vapor of glycerin which had been heated to 300° C. and had an equilibrium vapor pressure, with a nitrogen carrier gas. In addition, the used dry air contained 20 vol. % oxygen molecules and 80 vol. % nitrogen molecule, and the moisture therein was previously removed.

By the above described heat treatment, a dispersion-coated layer on a slide glass was converted to a sintered product layer with an average film thickness of 5 µm.

[Measurement for Volume Resistivity of Sintered Product Layer]

The obtained sintered product layer was regarded as the uniform thin layer with a width of 1 cm, a length 5 cm and an average film thickness of 5 µm, and its volume resistivity was measured. The measured volume resistivity was 9.8 µΩ·cm.

[Evaluation for State of Copper Fine Particles Cohering With Each Other in Sintered Product]

The state of copper fine particles cohering with each other in the obtained sintered product layer, by observing the presence or absence of the copper fine particles easily exfoliating from the surface. Specifically, it was evaluated by observing the presence or absence of the exfoliating copper fine particles when a friction in such a level as scrubbing with a latex-gloved finger was added onto the surface of the obtained sintered product layer.

In a sintered product layer obtained in the present example, no copper fine particle was found to exfoliate from the surface by the friction treatment. As a result of having actually observed the surface of the obtained sintered product layer with a SEM, the copper fine particles were confirmed to be closely sintered with each other.

Examples 2-2 to 2-5

A strip-shaped coated layer was formed with the use of a pasty dispersion prepared in Example 2-1, and was subjected to the reducing/sintering treatments in the same conditions as in Example 2-1, except that a heating temperature in the following heat treatment was changed to a range between 250 and 350° C.

Evaluation results for Example 2-1 and Examples 2-2 to 2-5 are shown together in Table 2-1.

TABLE 2-1

| | Example 2-2 | Example 2-3 | Example 2-1 | Example 2-4 | Example 2-5 |
|---|---|---|---|---|---|
| Heating temperature (° C.) for reducing/sintering treatment | 250 | 275 | 300 | 325 | 350 |
| First treatment duration (minute) | 5 | 5 | 5 | 5 | 5 |
| Total time (minute) for second treatment | 15 | 15 | 15 | 15 | 15 |
| Oxidizing/re-reducing treatment repeated number of times (times) | 5 | 5 | 5 | 5 | 5 |
| Thickness ratio of sintered film to coated film | 5 µm/ 10 µm | 5 µm/ 10 µm | 5 µm/ 10 µm | 5 µm/ 10 µm | 5 µm/ 10 µm |
| Volume resistivity (µΩ · cm) | Measurement impossible | 860.2 | 9.8 | 8.8 | 8.2 |
| Cohering state after reducing/sintering treatment | X | ◯ | ◯ | ◯ | ◯ |

◯: no exfoliating copper fine particle when friction was added;
X: recognizable exfoliating copper fine particles when friction was added When comparing results shown in Table 2-1, it was clear that an adequate electroconductivity of 10 μΩ·cm or less was achieved at a heating temperature of 300° C. or higher. Even when a heating temperature raised, the volume resistivity did not greatly decrease.

Examples 2-6 to 2-9

A strip-shaped coated layer was formed with the use of a pasty dispersion prepared in Example 2-1, and was subjected to the heating treatment of the reducing/sintering treatments in the same conditions as in Example 2-1, except that the repeating number of times of the oxidizing treatment and the re-reducing treatment to be performed in the second treatment step was changed to a range between 0 and 10 times.

Evaluation results for-Example 2-1 and Examples 2-6 to 2-9 are shown together in Table 2-2.

TABLE 2-2

|  | Example 2-6 | Example 2-7 | Example 2-8 | Example 2-1 | Example 2-9 |
| --- | --- | --- | --- | --- | --- |
| Heating temperature (° C.) for reducing/sintering treatment | 300 | 300 | 300 | 300 | 300 |
| First treatment duration (minute) | 5 | 5 | 5 | 5 | 5 |
| Total time (minute) for second treatment | 15 | 15 | 15 | 15 | 30 |
| Oxidizing/re-reducing treatment repeated number of times (times) | 0 | 1 | 3 | 5 | 10 |
| Thickness ratio of sintered film to coated film | 5 μm/ 10 μm | 5 μm/ 10 μm | 5 μm/ 10 μm | 5 μm/ 10 μm | 5 μm/ 10 μm |
| Volume resistivity (μΩ · cm) | $1.1 \times 10^4$ | 92.5 | 18.7 | 9.8 | 9.4 |
| Cohering state after reducing/sintering treatment | X | ○ | ○ | ○ | ○ |

○: no exfoliating copper fine particle when friction was added;
X: recognizable exfoliating copper fine particles when friction was added When comparing results shown in Table 2-2, it was clear that sintering proceeds step by step and volume resistivity is lowered along with the increasing repeated number of times of the oxidizing and re-reducing treatments performed in the second treatment step. However, even if the repeated number of times is increased to more than five times, further remarkable improvement was not found.

Example 2-10

A strip-shaped coated layer was formed with the use of a pasty dispersion prepared in Example 2-1, and was subjected to the reducing/sintering treatment in the same conditions as in Example 2-2, except that the repeating number of times of the oxidizing treatment and re-reducing treatments to be performed in the second treatment step in the following heating treatment was changed to 10 times.

Evaluation results for Example 2-2 and Examples 2-9 and 2-10 are shown together in Table 2-3.

TABLE 2-3

|  | Example 2-2 | Example 2-10 | Example 2-9 |
| --- | --- | --- | --- |
| Heating temperature (° C.) for reduction/sintering treatment | 250 | 250 | 300 |
| First treatment duration (minute) | 5 | 5 | 5 |
| Total time (minute) for second treatment | 15 | 30 | 30 |
| Oxidizing/re-reducing treatment repeated number of times (times) | 5 | 10 | 10 |
| Thickness ratio of sintered film to coated film | 5 μm/ 10 μm | 5 μm/ 10 μm | 5 μm/ 10 μm |
| Volume resistivity (μΩ · cm) | Measurement impossible | Measurement impossible | 9.4 |

TABLE 2-3-continued

|  | Example 2-2 | Example 2-10 | Example 2-9 |
| --- | --- | --- | --- |
| Cohering state after reducing/sintering treatment | X | X | ○ |

○: no exfoliating copper fine particle when friction was added;
X: recognizable exfoliating copper fine particles when friction was added A main cause of the result in which a dense sintered product layer was not obtained even in the heat treatment conditions of Example 2-10, was considered to be the same cause as in the result of the above described Example 2-2. Specifically, it was considered to be because though most of a reaction for reducing a surface oxide film is performed in the first treatment step, in the condition of a heating temperature of 300° C. or lower, the reducing treatment in the first treatment step was not sufficiently performed, and even if the copper fine particles were then subjected to the second treatment step, they were not adequately sintered with each other.

Examples 2-11 to 2-13

A strip-shaped coated layer was formed with the use of a pasty dispersion prepared in Example 2-1, and was subjected to the reducing/sintering treatments in the same conditions as in Example 2-1, except that a compound having reducibility to be used in the following heat treatment was changed to those shown in the following Table 2-4.

TABLE 2-4

(Compounds having reducibility used in reducing treatment)

| | Compounds having reducibility | Molecular weight | Melting point | Boiling point |
|---|---|---|---|---|
| Example 2-1 | glycerin | 92.10 | 18.07° C. | 290.5° C. (decomposed) |
| Example 2-11 | ethyleneglycol | 62.07 | −12.6° C. | 197.6° C. |
| Example 2-12 | erythritol | 122.12 | 121° C. | 329-331° C. |
| Example 2-13 | hydrogen molecule | 2.02 | −259.2° C. | −252.8° C. |

(Mixing ratio of compound having reducibility used for reducing treatment to nitrogen)

| | Compound having reducibility | Content ratio in mixed gas vol. % | Supply source |
|---|---|---|---|
| Example 2-1 | glycerin | 20 | Equilibrium vapor pressure with liquid heated to 300° C. |
| Example 2-11 | ethyleneglycol | 20 | Equilibrium vapor pressure with liquid heated to 300° C. |
| Example 2-12 | erythritol | 12 | Equilibrium vapor pressure with liquid heated to 300° C. |
| Example 2-13 | hydrogen molecule | 3 | Gas |

Evaluation results for Example 2-1 and Examples 2-11 to 2-13 are shown together in Table 2-5.

TABLE 2-5

| | Example 2-1 | Example 2-11 | Example 2-12 | Example 2-13 |
|---|---|---|---|---|
| Heating temperature (° C.) for reducing/sintering treatment | 300 | 300 | 300 | 300 |
| First treatment duration (minute) | 5 | 5 | 5 | 5 |
| Total time (minute) for second treatment | 15 | 15 | 15 | 15 |
| Oxidizing/re-reducing treatment repeated number of times (times) | 5 | 5 | 5 | 5 |
| Compounds having reducibility | glycerin | ethylene glycol | erythritol | hydrogen molecule |
| Thickness ratio of sintered film to coated film | 5 μm/ 10 μm | 5 μm/ 10 μm | 5 μm/ 10 μm | 5 μm/ 10 μm |
| Volume resistivity (μΩ · cm) | 9.8 | 10.6 | 10.2 | 11.8 |

TABLE 2-5-continued

| | Example 2-1 | Example 2-11 | Example 2-12 | Example 2-13 |
|---|---|---|---|---|
| Cohering state after reducing/sintering treatment | ◯ | ◯ | ◯ | ◯ |

◯: no exfoliating copper fine particle when friction was added;
X: recognizable exfoliating copper fine particles when friction was added When comparing results shown in Table 2-5, it was clear that a sintered product layer formed by using ethylene glycol, erythritol and hydrogen molecule similarly to glycerin, as a compound having reducibility, achieved adequate electro-conductivity of about 10 μΩ·cm by volume resistivity. It was confirmed that the operation of repeatedly performing the oxidizing treatment and the re-reducing treatment had the same level of an effect over a wide range of types of used compounds having reducibility.

Comparative Example 2-1

A strip-shaped coated layer was formed with the use of a pasty dispersion prepared in Example 2-1, and was subjected to the heating treatment of the reducing/sintering treatments in the same conditions as in Example 2-1, except that the operation of repeating the oxidizing treatment and the re-reducing treatment in the second treatment step following to the first treatment step in the following heating treatment was changed to the treatment of heating and holding in a nitrogen atmosphere for 15 minutes.

The obtained sintered product layer of copper fine particles was subjected to measurement for volume resistivity and evaluation for a state of the copper fine particles cohering with each other, according to the evaluation steps in the above described Example 2-1.

Comparative Example 2-2

A strip-shaped coated layer was formed with the use of a pasty dispersion prepared in Example 2-1, and was subjected to the reducing/sintering treatment in the same conditions as in Example 2-1, except that the operation of repeating the oxidizing treatment and the re-reducing treatment in the second treatment step following to the first treatment step in the following heating treatment was changed to the treatment of continuing oxidizing the coated layer in an atmosphere of dry air for one minute, and subsequently continuing heating it in the atmosphere of a mixed gas of glycerin vapor/nitrogen gas for 14 minutes.

Evaluation results for Examples 2-6 and 2-7 and Comparative Examples 2-1 and 2-2 are shown together in Table 2-6.

TABLE 2-6

|  | Example 2-6 | Example 2-7 | Comparative Example 2-1 | Comparative Example 2-2 |
|---|---|---|---|---|
| Heating temperature (° C.) for reducing/sintering treatment | 300 | 300 | 300 | 300 |
| First treatment duration (minute) | 5 | 5 | 5 | 5 |
| Total time (minute) for second treatment | 15 | 15 | 15 | 15 |
| Condition of second treatment step |  |  | Inert atmosphere treatment |  |
| Oxidation time t1 | 0 sec. | 10 sec. |  | 60 sec. |
| Re-reducing/baking treatment time t2 | 15 min. 0 sec. | 14 min. 50 sec. | 15 min. 0 sec. | 14 min. 00 sec. |
| Thickness ratio of sintered film to coated film | 5 μm/10 μm | 5 μm/10 μm | 5 μm/10 μm | 5 μm/10 μm |
| Volume resistivity (μΩ · cm) | 1.1 × 10$^4$ | 92.5 | measurement impossible | 1.0 × 10$^4$ |
| Cohering state after reducing/sintering treatment | X | ○ | X | X |

○: no exfoliating copper fine particle when friction was added;
X: recognizable exfoliating copper fine particles when friction was added When comparing results shown in Table 2-6, it was confirmed that reduced copper fine particles are effectively sintered with each other by selecting a technique consisting of reducing the copper fine particles in the first treatment step, then oxidizing it in an atmosphere of dry air for a short time, and subsequently re-reducing it in an atmosphere of a mixed gas of vapor of a compound having reducibility and nitrogen gas, in a reducing/sintering treatment step.

Examples 2-14 and 2-15

A pasty dispersion was prepared by using ethylene glycol (melting point: −12.6° C., boiling point: 197.6° C.) in Example 2-14 as a substitute for 2-ethylhexane-1,3-diol used for a dispersing solvent in Example 2-1, and by using N14 (tetradecane, melting point of 5.86° C., boiling point of 253.57° C., a product made by Japan Energy Corporation) in Example 2-15. The obtained pasty dispersion had viscosities (25° C.) of 1 Pa·s in Example 2-14 and 1 Pa·s in Example 2-15. In addition, the prepared pasty dispersion had the volume ratios of copper fine particles, of 45 vol. % in Example 2-14 and 45 vol. % in Example 2-15.

A strip-shaped coated layer was formed with the use of a prepared pasty dispersion, and was subjected to the reducing/sintering treatments in the same conditions as in Example 1, in the following heat treatment.

Evaluation results for Example 2-1 and Examples 2-14 to 2-15 are shown together in Table 2-7.

TABLE 2-7

|  | Example 2-1 | Example 2-14 | Example 2-15 |
|---|---|---|---|
| Heating temperature (° C.) for reducing/sintering treatment | 300 | 300 | 300 |
| First treatment duration (minute) | 5 | 5 | 5 |
| Total time (minute) for second treatment | 15 | 15 | 15 |
| Oxidizing/re-reducing treatment repeated number of times (times) | 5 | 5 | 5 |
| dispersing solvent | 2-ethylhexane-1,3-diol | ethylene glycol | N14 |
| Thickness ratio of sintered film to coated film | 5 μm/10 μm | 5 μm/10 μm | 5 μm/10 μm |
| Volume resistivity (μΩ · cm) | 9.8 | 10.1 | 10.7 |
| Cohering state after reducing/sintering treatment | ○ | ○ | ○ |

○: no exfoliating copper fine particle when friction was added;
X: recognizable exfoliating copper fine particles when friction was added When comparing results, it was confirmed that a type of a dispersing solvent used in a pasty dispersion did not essentially affect an effect of repeating the oxidizing treatment and the re-reducing treatment performed in the second treatment in the heat treatment, and accordingly a wide range of types of dispersing solvents can be used.

Example 2-16

A pasty dispersion in Example 2-16 was prepared by adding 20 g of 2-ethylhexane-1,3-diol as a dispersing solvent, to 80 g of an atomized copper powder 1300Y having a larger particle diameter (with an average particle diameter of 3.3 μm) made by Mitsui Mining & Smelting, and stirring it till it became uniform. The obtained pasty dispersion had the viscosity (25° C.) of 1 Pa·s. In addition, a volume ratio of the copper fine particles in the above pasty dispersion was 45 vol. %.

A strip-shaped coated layer was formed with the use of a prepared pasty dispersion, and was subjected to the reducing/sintering treatments in the same conditions as in Example 2-1, in the following heat treatment.

Evaluation results for Example 2-1 and Example 2-16 are shown together in Table 2-8.

TABLE 2-8

|  | Example 2-16 | Example 2-1 |
|---|---|---|
| Heating temperature (° C.) for reducing/sintering treatment | 300 | 300 |
| First treatment duration (minute) | 5 | 5 |
| Total time (minute) for second treatment | 15 | 15 |
| Oxidizing/re-reducing treatment repeated number of times (times) | 5 | 5 |
| Average particle diameter (μm) of copper fine particles | 3.3 | 0.9 |
| Thickness ratio of sintered film to coated film | 5 μm/10 μm | 5 μm/10 μm |
| Volume resistivity (μΩ · cm) | 12.4 | 9.8 |
| Cohering state after reducing/sintering treatment | ○ | ○ |

○: no exfoliating copper fine particle when friction was added;
X: recognizable exfoliating copper fine particles when friction was added Examples 2-17 to 2-19 and Examples 2-20 to 2-22

A pasty dispersion in Example 2-17 was prepared by adding 25 g of 2-ethylhexane-1,3-diol as a dispersing solvent, to 75 g of the copper fine particle which was a copper nano-particle produced in a wet process, (with an average particle diameter of 30 nm) made by C. I. KASEI. CO., LTD., and by stirring it till it became uniform. The obtained pasty dispersion with a composition in Example 2-17 had the viscosity (25° C.) of 5 Pa·s.

A strip-shaped coated layer was formed with the use of a prepared pasty dispersion, and was subjected to the reducing/sintering treatments in the same conditions as in Example 2-1, in the following heat treatment.

A strip-shaped coated layer was formed with the use of a pasty dispersion prepared in Example 2-17, and was subjected to the reducing/sintering treatments in the same conditions as in Example 2-17, except that a heating temperature in the following heat treatment was changed to 250° C. and 275° C.

On the other hand, a pasty dispersion in Example 2-20 was prepared by adding 25 g of tetradecane as a dispersing solvent, to 75 g of the UC copper fine particles (with an average particle diameter of 5 nm), which were copper nano-particles prepared by using an in-gas evaporation method, and by stirring it till it became uniform. The obtained pasty dispersion with a composition in Example 2-20 had the viscosity (25° C.) of 0.1 Pa·s.

A strip-shaped coated layer was formed with the use of a prepared pasty dispersion, and was subjected to the reducing/sintering treatments in the same conditions as in Example 2-1, in the following heat treatment.

A strip-shaped coated layer was formed with the use of a pasty dispersion prepared in Example 2-20, and was subjected to the reducing/sintering treatments in the same conditions as in Example 2-20, except that a heating temperature in the following heat treatment was changed to 250° C. and 275° C.

Evaluation results for Example 2-17 to 2-19 and Examples 2-20 to 2-22 are shown together in Table 2-9.

TABLE 2-9

|  | Example 2-17 | Example 2-18 | Example 2-19 |
|---|---|---|---|
| Heating temperature (° C.) for reducing/sintering treatment | 300 | 275 | 250 |
| First treatment duration (minute) | 5 | 5 | 5 |
| Total time (minute) for second treatment | 15 | 15 | 15 |
| Oxidizing/re-reducing treatment repeated number of times (times) | 5 | 5 | 5 |
| Average particle diameter (nm) of copper fine particles | 30 | 30 | 30 |
| Thickness ratio of sintered film to coated film | 1 μm/10 μm | 1 μm/10 μm | 1 μm/10 μm |
| Volume resistivity (μΩ · cm) | 3.8 | 5.9 | 11.0 |
| Cohering state after reducing/sintering treatment | ○ | ○ | ○ |

|  | Example 2-20 | Example 2-21 | Example 2-22 |
|---|---|---|---|
| Heating temperature (° C.) for reducing/sintering treatment | 300 | 275 | 250 |
| First treatment duration (minute) | 5 | 5 | 5 |
| Total time (minute) for second treatment | 15 | 15 | 15 |
| Oxidizing/re-reducing treatment Repeated number of times (times) | 5 | 5 | 5 |
| Average particle diameter (nm) of copper fine particles | 5 | 5 | 5 |
| Ratio of film thickness after sintering treatment/coated film thickness | 1 μm/10 μm | 1 μm/10 μm | 1 μm/10 μm |
| Volume resistivity (μΩ · cm) | 2.6 | 3.4 | 4.8 |
| Cohering state after reducing/sintering treatment | ○ | ○ | ○ |

○: no exfoliating copper fine particle when friction was added;
X: recognizable exfoliating copper fine particles when friction was added When particles with diameters in a nanometric size range were used, an obtained sintered product layer heated at a temperature of 300° C. or lower achieved an adequate electroconductivity of about 10 μΩ·cm or lower by volume resistivity, due to a nanometric size effect.

Examples 2-23 to 2-25

A strip-shaped coated layer was formed with the use of a pasty dispersion prepared in Example 2-20, and was subjected to the reducing/sintering treatments in the same conditions as in Example 2-22 except that a heating temperature in the following heat treatment was changed to 250° C., and a compound having reducibility to be used was changed to those shown in the following Table 2-10.

TABLE 2-10

(Compounds having reducibility used in reducing treatment)

| | Compounds having reducibility | Molecular weight | Melting point | Boiling point |
|---|---|---|---|---|
| Example 2-22 | glycerin | 92.10 | 18.07° C. | 290.05° C. (decomposed) |
| Example 2-23 | ethyleneglycol | 62.07 | −12.6° C. | 197.6° C. |
| Example 2-24 | propyleneglycol | 76.10 | −60° C. | 187° C. |
| Example 2-25 | 1,3-propanediol | 76.10 | −26° C. | 214° C. |

(Mixing ratio of compound having reducibility used for reducing treatment to nitrogen)

| | Compounds having reducibility | Content ratio in mixed gas vol. % | Supply source |
|---|---|---|---|
| Example 2-22 | glycerin | 20 | Equilibrium vapor pressure with liquid heated to 300° C. |
| Example 2-23 | ethyleneglycol | 20 | Equilibrium vapor pressure with liquid heated to 300° C. |
| Example 2-24 | propyleneglycol | 20 | Equilibrium vapor pressure with liquid heated to 300° C. |
| Example 2-25 | 1,3-propanediol | 20 | Equilibrium vapor pressure with liquid heated to 300° C. |

TABLE 2-11

| | Example 2-22 | Example 2-23 | Example 2-24 | Example 2-25 |
|---|---|---|---|---|
| Heating temperature (° C.) for reducing/sintering treatment | 250 | 250 | 250 | 250 |
| First treatment duration (minute) | 5 | 5 | 5 | 5 |
| Total time (minute) for second treatment | 15 | 15 | 15 | 15 |
| Oxidizing/re-reducing treatment repeated number of times (times) | 5 | 5 | 5 | 5 |
| Compounds having reducibility | glycerin | ethyleneglycol | propylene glycol | 1,3-propanediol |
| Thickness ratio of sintered film to coated film | 1 μm/10 μm | 1 μm/10 μm | 1 μm/10 μm | 1 μm/10 μm |
| Volume resistivity (μΩ · cm) | 4.8 | 3.6 | 3.9 | 4.4 |
| Cohering state after reducing/sintering treatment | ○ | ○ | ○ | ○ |

○: no exfoliating copper fine particle when friction was added;
X: recognizable exfoliating copper fine particles when friction was added When comparing results shown in Table 2-11, it was clear that a sintered product layer formed of particles with a nanometric size range of diameter achieved adequate electroconductivity of about 5 μΩ·cm lower, even when heated at a temperature of 250° C. or lower, and having employed ethylene glycol, propylene glycol and 1,3-propanediol similarly to glycerin, as a compound having reducibility, in repeating the oxidizing treatment and the re-reducing treatment.

Example 2-26

A pasty dispersion in Example 2-26 was prepared by adding 20 g of 2-ethylhexane-1,3-diol as a dispersing solvent to 80 g of a mixture consisting of 9 parts by mass of an atomized copper powder 1300Y (with an average particle diameter of 3.3 μm) made by Mitsui Mining & Smelting and 1 parts by mass of UC copper fine particles (with an average particle diameter of 5 nm), and by stirring it till it became uniform. The obtained pasty dispersion had the viscosity (25° C.) of 1 Pa·s. In addition, a volume ratio of the copper fine particles in the above pasty dispersion was 45 vol. %.

A strip-shaped coated layer was formed with the use of a prepared pasty dispersion, and was subjected to the reducing/sintering treatments in the same conditions as in Example 2-16, in the following heat treatment.

Evaluation results for Example 2-16 and Example 2-26 are shown together in Table 2-12.

TABLE 2-12

| | Example 2-16 | Example 2-26 |
|---|---|---|
| Heating temperature (° C.) for reducing/sintering treatment | 300 | 300 |
| First treatment duration (minute) | 5 | 5 |
| Total time (minute) for second treatment | 15 | 15 |
| Oxidizing/re-reducing treatment repeated number of times (times) | 5 | 5 |
| Average particle diameter (μm) of copper fine particles | 3.3 | mixture |
| Thickness ratio of sintered film to coated film | 5 μm/10 μm | 5 μm/10 μm |
| Volume resistivity (μΩ · cm) | 12.4 | 6.1 |
| Cohering state after reducing/sintering treatment | ○ | ○ |

○: no exfoliating copper fine particle when friction was added;
X: recognizable exfoliating copper fine particles when friction was added By concomitantly using particles with comparatively large diameters of a micrometer size and diameters of an extremely fine nanometric size, an effect of significantly decreasing the volume resistivity in the obtained sintered product layer was achieved.

INDUSTRIAL APPLICABILITY

A process for forming a fine-shaped conductor of sintered product type of copper fine particles, a process for forming a fine copper-based wiring pattern with the use of the process, or a process for forming a copper thin film according to the present invention, can be employed as method of producing a fine-shaped conductor layer of sintered product type of the copper fine particles having superior electrical conductivity of about 10 μΩ·cm by volume resistivity with high reproducibility and productivity, which can be preferably used for forming a conductor layer of a fine circuit pattern, for instance, with a wiring width of wiring of 200 μm or less, particularly 50 μm or less, and a space between wires of 200 μm or less, particularly 50 μm or less, when producing a plated printed circuit used in the mounting of an electronic component for electronic equipment.

The invention claimed is:

1. A process for forming a copper-based fine pattern consisting of a sintered product layer made of copper nano-particles sintered with each other, which process comprises the steps of:
   drawing a layer coated on a substrate, which layer has a fine pattern, by using a dispersion containing copper oxide nano-particles or copper nano-particles provided with a surface oxide film layer, which particles have an average particle diameter of 1 to 100 nm, together with a dispersion medium thereof and
   subjecting the copper oxide nano-particles or the copper nano-particles provided with the surface oxide film layer contained in the coated layer drawn by using the dispersion to a reducing treatment, wherein the copper oxides or surface oxide film layer are reduced at a heating temperature selected form the range of 180° C. to 300° C. by using an organic compound having reducing activity, and further a baking treatment wherein the copper nano-particles resulting from the reducing treatment are baked at the heating temperature selected from the range of 180° C. to 300° C. to form a sintered product layer made of the copper nano-particles in the fine pattern,
   wherein the sintered product layer made of copper nano-particles that is formed by the process consists of the copper nano-particles sintered with each other, the coated layer drawn by using the dispersion contains the dispersion medium, the dispersion medium is an organic solvent, and said reducing treatment and the baking treatment that is carried out by heating at a heating temperature selected from the range of 180° C. to 300° C. in single stage which is conducted by heating the copper oxide nano-particles or the copper nano-particles with the surface oxide film layer contained in the coated layer in the presence of the organic compound having reducing activity at the heating temperature selected from the range of 180° C. to 300° C., thereby giving rise to the action of said organic compound having reducing activity on the copper oxide nano-particles or the surface oxide film layer.

2. The process according to claim 1, wherein in the copper nano-particle with the surface oxide film layer contained in the dispersion, said surface oxide film layer comprises cuprous oxide, cupric oxide or a mixture thereof, and the nano-particle is a particle that contains metallic copper and one or more selected from the group consisting of cuprous oxide, cupric oxide and a mixture of the foregoing.

3. The process according to claim 1, wherein said organic compound having reducing activity is an organic compound having a hydroxyl group that is transformable to an oxo group (=O) or a formyl group (—CHO) by oxidation, or a mixture containing two or more types thereof.

4. The process according to claim 1, wherein said organic compound having reducing activity is selected from an organic compound having an alcoholic hydroxyl group, or a mixture containing two or more types thereof.

5. The process according to claim 1, wherein said organic compound having reducing activity is selected from an organic compound having two or more hydroxyl groups, or a mixture containing two or more types thereof.

6. The process according to claim 1, wherein said organic compound having reducing activity is glycerin (1,2,3-propanetriol).

7. The process according to claim 1, wherein at least one of said organic compounds having reducing activity is blended in the dispersion containing the copper oxide nano-particles or the copper nano-particles provided with the surface oxide film layer.

8. The process according to claim 1, wherein in the step of the reducing treatment, at least one of said organic compounds having reducing activity is vaporized to act on the coated layer having the fine pattern, in vapor phase containing at least vapor of said organic compound having reducing activity.

9. The process according to claim 1, wherein in the coated layer having the fine pattern drawn on the substrate,
   a minimum line width of the fine pattern is selected from a range of 0.5 to 200 μm, and a minimum space width between adjacently lying lines of the fine pattern is selected from a range of 0.5 to 200 μm, and
   the average particle diameter of the copper oxide nano-particles or the copper nano-particles provided with the surface oxide film layer contained in the dispersion is selected from the values of 1/10 or less of the minimum line width and the minimum space width of the fine pattern.

10. The process according to claim 1, wherein the step of drawing is conducted by a screen-printing method, an ink-jet method or a transferring method.

11. The process according to claim 1, wherein in the copper-based fine pattern to be formed on the substrate,
   a minimum thickness of the copper-based fine pattern is selected from a range of 0.1 to 20 pm, and
   the average particle diameter of the copper oxide nano-particles or the copper nano-particles with the surface oxide film layer contained in the dispersion is selected from values of 1/10 or less of the minimum thickness thereof.

12. A process for forming a copper thin-film layer consisting of a sintered product layer made of copper fine particles sintered with each other, wherein the process comprises the steps of:
   drawing a layer coated on a substrate by using a dispersion containing copper oxide fine particles or copper fine particles provided with a surface oxide film layer, which particles have an average particle diameter of 10 μm or less, together with a dispersion medium thereof and
   subjecting the copper oxide fine particles or the copper fine particles with the surface oxide film layer contained in the coated layer drawn by using the dispersion to a reducing treatment wherein the copper oxides or the surface oxide film layer are reduced at a heating temperature selected form the range of 250° C. to 350° C. by using an organic compound having reducing activity, and further to a baking treatment wherein the copper fine particles resulting from the reducing treatment are baked at the heating temperature selected form the range of 250° C. to 350° C. to form a sintered product layer made of the copper fine particles,
   wherein the sintered product layer made of copper fine particles sintered with each other consists of the copper fine particles sintered with each other, the coated layer drawn by using the dispersion contains the dispersion medium, the dispersion medium is an organic solvent, said reducing treatment and the baking treatment comprise the following two steps that are executed sequentially in a single process at the heating temperature selected from the range of 250° C. to 350° C.:
   a first treatment step of heating the copper oxide fine particles or the copper fine particles provided with the surface oxide film layer contained in the coated layer for duration of 1 min. to 15 min. at the heating temperature selected from the range of 250° C. to 350° C. in the presence of an organic compound having reducing activity to give rise to the action of said organic compound having reducing activity thereon, and thereby reducing the copper oxides composing the copper oxide fine particles or the copper fine particles provided with the surface oxide film layer to provide copper fine particles; and a second treatment step of subjecting said copper fine particles obtained in the first treatment step to a combined treatment of oxidation/re-reduction at least one time, which includes a stage of subjecting the copper fine particles to a surface oxidization treatment by heating for 30 seconds or shorter at the heating temperature selected from the range of 250° C. to 350° C. under an atmosphere containing oxygen to give rise to the action of oxygen thereon, and then a stage of subjecting the copper fine particles, which have undergone the surface oxidization treatment, to a re-reduction treatment by heating the particles for 30 seconds or longer but 300 seconds or shorter at the heating temperature selected from the range of 250° C. to 350° C. under an atmosphere containing gas or vapor of said organic compound having reducing activity to give rise to the action of said organic compound having reducing activity thereon.

13. The process according to claim 12, wherein the copper thin-film layer is made of the sintered product layer made of the copper fine particles being shaped into a predetermined plane-view pattern, wherein in said sintered product layer made of the copper fine particles, a minimum film thickness is selected from a range of 0.1 to 20 μm, a maximum film thickness is selected from a range of 100 μm or smaller, and the minimum line width of the plane-view pattern is selected from a range of 0.5 to 200 μm, and the average particle diameter of the copper oxide fine particles or the copper fine particles provided with the surface oxide film layer is selected within ½ of said minimum film thickness and within 1/10 of said minimum line width of predetermined plane-view pattern.

14. The process according to claim 13, wherein said organic compound having reducing activity used in said first treatment step and the re-reduction treatment stage of said second treatment step is an organic compound having a hydroxyl group that is transformable to an oxo group (=O) or a formyl group (—CHO) by oxidation, or a mixture containing two or more types thereof.

15. The process according to claim 13, wherein said organic compound having reducing activity used in said first treatment step and the re-reduction treatment stage of said second treatment step is a polyvalent alcohol compound having two or more hydroxyl groups in a molecule, or a mixture containing two or more types thereof.

16. The process according to claim 13, wherein said organic compound having reducing activity used in said first treatment step and the re-reduction treatment stage of said second treatment step is any one of glycerin (1,2,3-propanetriol), ethylene glycol (1,2-ethanediol), propylene glycol (1,2-propanediol) and 1,3-propanediol.

17. The process according to claim 13, wherein a dispersion medium contained in the dispersion containing the copper oxide fine particles or the copper fine particles with the surface oxide film layer is an alcoholic compound having a melting point of 10° C. or lower, and a hydroxyl group which is transformable to an oxo group (=O) or a formyl group (—CHO) by oxidation.

18. The process according to claim 1, wherein the copper-based fine pattern is a copper-based fine pattern for wiring of a plated circuit.

19. The process according to claim 12, wherein the copper thin-film layer is formed for a fine copper-based wiring pattern.

20. The process according to claim 13, wherein in the copper fine particles with the surface oxide film layer contained in the dispersion, said surface oxide film layer comprises cuprous oxide, cupric oxide or the mixture thereof, and the fine particle is a particle in the shape of mixture containing metallic copper and one or more selected from the group consisting of cuprous oxide, cupric oxide and a mixture of the foregoing.

21. The process according to claim 12, wherein said copper oxide fine particles or copper fine particles provided with a surface oxide film layer, which particles have an average particle diameter of 10 μm or less, is copper oxide nano-particles or copper nano-particles provided with a surface oxide film layer, which particles have an average particle diameter of 1 to 100 nm.

22. A process for forming a copper thin-film layer consisting of a product layer made of copper fine particles sintered with each other, wherein the process comprises the steps of:

drawing a layer coated on a substrate by using a dispersion containing copper oxide fine particles or copper fine particles provided with a surface oxide film layer, which particles have an average particle diameter of 10 μm or less, together with a dispersion medium thereof and subjecting the copper oxide fine particles or the copper fine particles with the surface oxide film layer contained in the coated layer drawn by using the dispersion to a reducing treatment wherein the copper oxides or the surface oxide film layer are reduced by using a hydrogen molecule at a heating temperature selected from the range of 250° C. to 350° C., and further to a baking treatment wherein the copper fine particles resulting from the reducing treatment are baked at the heating temperature selected from the range of 250° C. to 350° C. to form a sintered product layer of the copper fine particles, wherein the sintered product layer made of copper fine particles sintered with each other consists of the copper fine particles sintered with each other, the coated layer drawn by using the dispersion contains the dispersion medium, the dispersion medium is an organic solvent, said reducing treatment and the baking treatment comprise the following two steps that are executed sequentially in a single process at the heating temperature selected from the range of 250° C. to 350° C.:

a first treatment step of heating the copper oxide fine particles or the copper fine particles provided with the surface oxide film layer contained in the coated layer for duration of 1 min. to 15 min. at the heating temperature selected form the range of 250° C. to 350° C. in the presence of the hydrogen molecule to give rise to the action of said hydrogen molecule thereon, and thereby reducing the copper oxides composing the copper oxide fine particles or the copper fine particles provided with the surface oxide film layer to provide copper fine particles; and a second treatment step of subjecting said copper fine particles obtained in the first treatment step to a combined treatment of oxidation/re-reduction at least one time, which includes a stage of subjecting the copper fine particles to a surface oxidization treatment by heating for 30 seconds or shorter at the heating temperature selected from the range of 250° C. to 350° C. under an atmosphere containing oxygen to give rise to the action of oxygen thereon, and then a stage of subjecting the copper fine particles, which have undergone the surface oxidization treatment, to a re-reduction treatment by heating the particles for 30 seconds or longer but 300 seconds or shorter at the heating temperature selected from the range of 250° C. to 350° C. under an atmosphere containing said hydrogen molecule to give rise to the action of said hydrogen molecule thereon.

23. The process according to claim 22,
wherein in the copper fine particle with the surface oxide film layer contained in the dispersion, said surface oxide film layer comprises cuprous oxide, cupric oxide or the mixture thereof, and the fine particle is a particle in the shape of mixture containing metallic copper and one or more selected from the group consisting of cuprous oxide, cupric oxide and a mixture of the forgoing.

24. The process according to claim 22, wherein the copper thin-film layer is made of the sintered product layer made of the copper fine particles being shaped into a predetermined plane-view pattern,
wherein in said sintered product layer made of the copper fine particles, a minimum film thickness is selected from a range of 0.1 to 20 μm, a maximum film thickness is selected from a range of 100 μm or smaller, and the minimum line width of the plane-view pattern is selected from a range of 0.5 to 200 μm, and
the average particle diameter of the copper oxide fine particles or the copper fine particles provided with the surface oxide film layer is selected within ¼ of said minimum film thickness and within ¹⁄₁₀ of said minimum line width of predetermined plane-view pattern.

25. The process according to claim 22, wherein the copper thin-film layer is formed for a fine copper-based wiring pattern.

26. The process according to claim 1,
Wherein in the step of drawing the layer coated on the substrate, which layer has the fine pattern,
a dispersion containing copper oxide nano-particles or copper nano-particles provided with a surface oxide film layer, which particles have an average particle diameter of 1 to 20 nm, together with the dispersion medium thereof is used as the dispersion, so that the cupper nano-particles resulting from the reducing treatment have an average particle diameter of 1 to 20 nm.

27. The process according to claim 8, wherein in the step of the reducing treatment, the heating temperature is selected from the range of 250° C. to 300° C.

28. The process according to claim 7, wherein in the step of the reducing treatment, the heating temperature is selected from the range of 250° C. to 300° C.

29. The process according to claim 12, wherein the dispersion medium is an organic solvent having a melting point of 10° C. or lower and a boiling point selected form the range of 100° C. to 300° C.

30. The process according to claim 22, wherein the dispersion medium is an organic solvent having a melting point of 20° C. or lower and a boiling point selected form the range of 100° C. to 300° C.

* * * * *

UNITED STATES PATENT AND TRADEMARK OFFICE
CERTIFICATE OF CORRECTION

| | |
|---|---|
| PATENT NO. | : 7,820,232 B2 |
| APPLICATION NO. | : 10/556871 |
| DATED | : October 26, 2010 |
| INVENTOR(S) | : Daisuke Itoh et al. |

It is certified that error appears in the above-identified patent and that said Letters Patent is hereby corrected as shown below:

Column 18, Line 16, change "Further" to --further--;

Column 18, Line 23-24, change "hydroguinone" to --hydroquinone--;

Column 18, Line 24, change "hydroguinone" to --hydroquinone--;

Column 21, Line 11-12, change "resisatance" to --resistance--;

Column 22, Line 41, change "hydroguinone" to --hydroquinone--;

Column 22, Line 43, change "benzendiol:" to --benzenediol:--;

Column 23, Line 24, change "hydroguinone" to --hydroquinone--;

Column 23, Line 35, change "Perfectcopper," to --Perfect copper,--;

Column 26, Line 52, before "1" delete "of";

Column 29, Line 45, change "I,2-diol" to --1,2-diol--;

Column 45, Line 17, in Claim 1, change "form" to --from--;

Column 46, Line 25, in Claim 11, change "claim 1 ," to --claim 1,--;

Column 46, Line 28, in Claim 11, change "20pm," to --20µm,--;

Column 46, Line 48, in Claim 12, change "form" to --from--;

Column 46, Line 52, in Claim 12, change "form" to --from--;

Column 47, Line 38, in Claim 13, change "1/2" to --1/4--;

Column 48, Line 57, in Claim 22, change "form" to --from--;

Signed and Sealed this
Third Day of July, 2012

David J. Kappos
*Director of the United States Patent and Trademark Office*

CERTIFICATE OF CORRECTION (continued)
U.S. Pat. No. 7,820,232 B2

Column 50, Line 8, in Claim 26, change "Wherein" to --wherein--;

Column 50, Line 14, in Claim 26, change "cupper" to --copper--;

Column 50, Line 25, in Claim 29, change "form" to --from--;

Column 50, Line 29, in Claim 30, change "form" to --from--.